(12) United States Patent
He et al.

(10) Patent No.: US 10,663,479 B2
(45) Date of Patent: May 26, 2020

(54) DETERMINING AN OPEN/CLOSE STATUS OF A BARRIER

(71) Applicant: BlackBerry Limited, Waterloo (CA)

(72) Inventors: Dake He, Waterloo (CA); Alexander Levato, Toronto (CA); Yu Gao, Waterloo (CA)

(73) Assignee: BlackBerry Limited, Waterloo, Ontario (CA)

(*) Notice: Subject to any disclaimer, the term of this patent is extended or adjusted under 35 U.S.C. 154(b) by 522 days.

(21) Appl. No.: 15/442,454

(22) Filed: Feb. 24, 2017

(65) Prior Publication Data
US 2018/0172721 A1    Jun. 21, 2018

Related U.S. Application Data

(60) Provisional application No. 62/436,587, filed on Dec. 20, 2016.

(51) Int. Cl.
| | | |
|---|---|---|
| *G01P 15/02* | (2013.01) | |
| *G01C 21/10* | (2006.01) | |
| *H03H 17/04* | (2006.01) | |
| *G01C 19/00* | (2013.01) | |

(52) U.S. Cl.
CPC ............. *G01P 15/02* (2013.01); *G01C 21/10* (2013.01); *G01C 19/00* (2013.01); *H03H 17/04* (2013.01)

(58) Field of Classification Search
CPC ......... G01P 15/02; G01C 21/10; G01C 19/00; H03H 17/04
See application file for complete search history.

(56) References Cited

U.S. PATENT DOCUMENTS

| | | | |
|---|---|---|---|
| 5,736,923 A | 4/1998 | Saab | |
| 5,777,909 A * | 7/1998 | Leung | H03H 17/02 708/300 |
| 5,887,466 A | 3/1999 | Yoshizawa | |
| 6,008,731 A | 12/1999 | Capan | |
| 8,773,263 B2 | 7/2014 | Thibault | |
| 9,178,545 B2 * | 11/2015 | Ng | H04B 1/1027 |
| 10,006,929 B2 | 6/2018 | Ten Kate | |
| 2002/0174604 A1 | 11/2002 | Lauderbach | |
| 2006/0149496 A1 | 7/2006 | Takeuchi | |
| 2006/0232393 A1 | 10/2006 | Kimura | |
| 2006/0244577 A1 | 11/2006 | Tanaka | |
| 2008/0243373 A1 | 10/2008 | Cat | |
| 2009/0096599 A1 | 4/2009 | Kranz | |

(Continued)

FOREIGN PATENT DOCUMENTS

| | | |
|---|---|---|
| EP | 0925967 A2 | 6/1999 |
| WO | 2008/033981 A2 | 3/2008 |

(Continued)

OTHER PUBLICATIONS

Wikipedia, Gyroscope last modified Jun. 5, 2016 (18 pages).

(Continued)

*Primary Examiner* — Judy Nguyen
*Assistant Examiner* — Leo T Hinze
(74) *Attorney, Agent, or Firm* — Trop, Pruner & Hu, P.C.

(57) ABSTRACT

In some examples, a method determines an open/close status of a pivotable barrier on a moveable platform based on selective use of a plurality of different filters for filtering measurement data from a sensor device.

23 Claims, 15 Drawing Sheets

(56) References Cited

U.S. PATENT DOCUMENTS

| | | |
|---|---|---|
| 2009/0102653 A1 | 4/2009 | McGinnis |
| 2010/0312188 A1 | 12/2010 | Robertson |
| 2011/0005282 A1 | 1/2011 | Powers |
| 2012/0129544 A1 | 5/2012 | Hodis |
| 2012/0212318 A1 | 8/2012 | Dobson |
| 2012/0330497 A1 | 12/2012 | De Tommasi |
| 2013/0057405 A1 | 3/2013 | Seelman |
| 2013/0268184 A1 | 10/2013 | Zagorski |
| 2014/0067313 A1 | 3/2014 | Breed |
| 2014/0142886 A1* | 5/2014 | Hergesheimer ......... G01P 15/18 702/141 |
| 2014/0203971 A1 | 7/2014 | Taylor, Jr. |
| 2014/0257630 A1 | 9/2014 | Ruiz |
| 2014/0358840 A1 | 12/2014 | Tadic |
| 2015/0027353 A1 | 1/2015 | Sagebiel |
| 2015/0244854 A1 | 8/2015 | Babel |
| 2015/0336434 A1 | 11/2015 | Hammerschmidt |
| 2016/0054148 A1 | 2/2016 | Misfatto |
| 2016/0094766 A1 | 3/2016 | Stanley |
| 2016/0159279 A1 | 6/2016 | Mori |
| 2016/0189511 A1 | 6/2016 | Peterson |
| 2016/0282112 A1 | 9/2016 | Scheiermann |
| 2018/0031604 A1 | 2/2018 | Chennakeshu |

FOREIGN PATENT DOCUMENTS

| | | |
|---|---|---|
| WO | 2009/079685 A1 | 7/2009 |
| WO | 2016/066422 A1 | 5/2016 |

OTHER PUBLICATIONS https://developer.android.com/guide/topics/sensors/sensors_motion.html—Motion Sensors—Android Developers downloaded Jun. 23, 2016 (13 pages).

Dake He, U.S. Appl. No. 15/442,457 entitled Determining Motion of a Moveable Platform filed Feb. 24, 2017 (70 pages).

Canadian Intellectual Property Office, International Search Report and Written Opinion for PCT/CA2017/051537 dated Mar. 22, 2018 (7 pages).

* cited by examiner

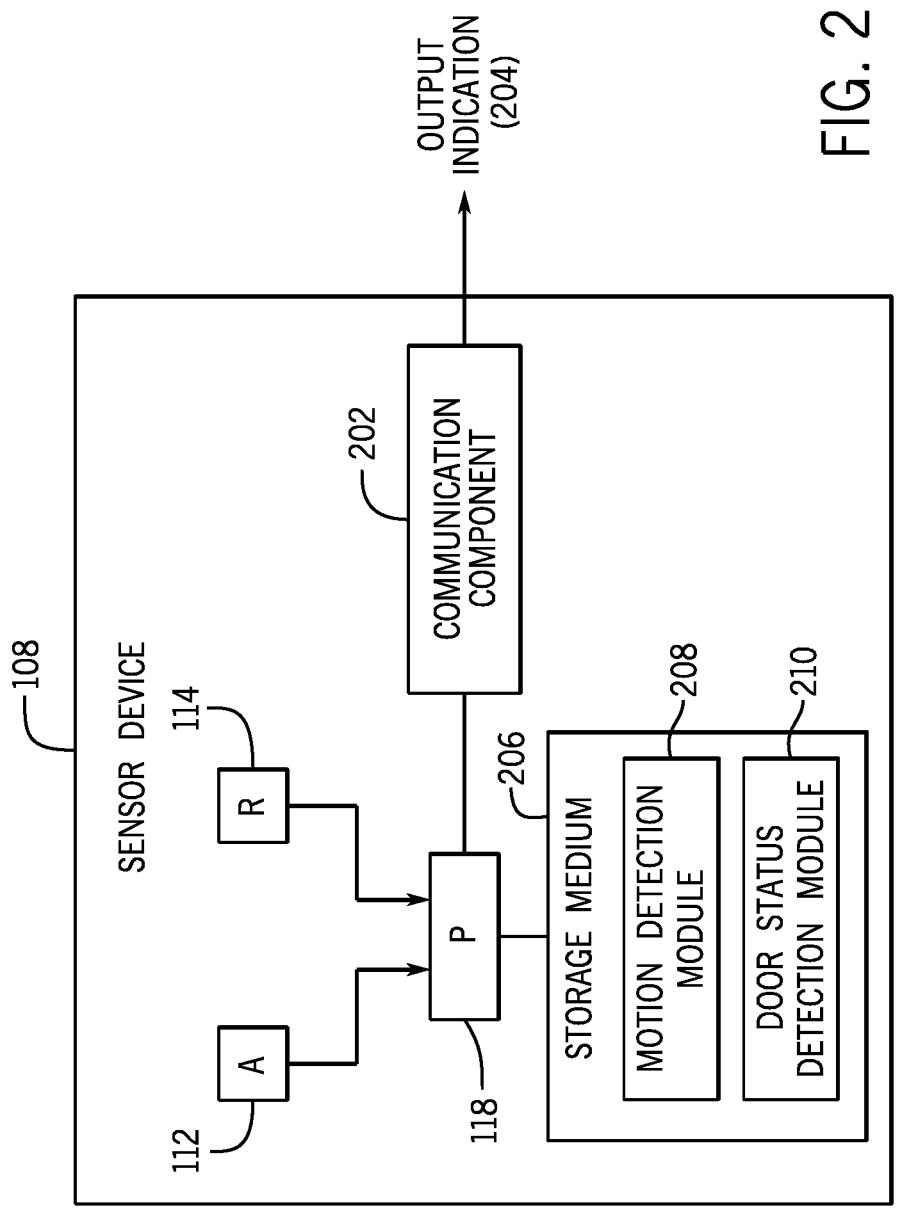

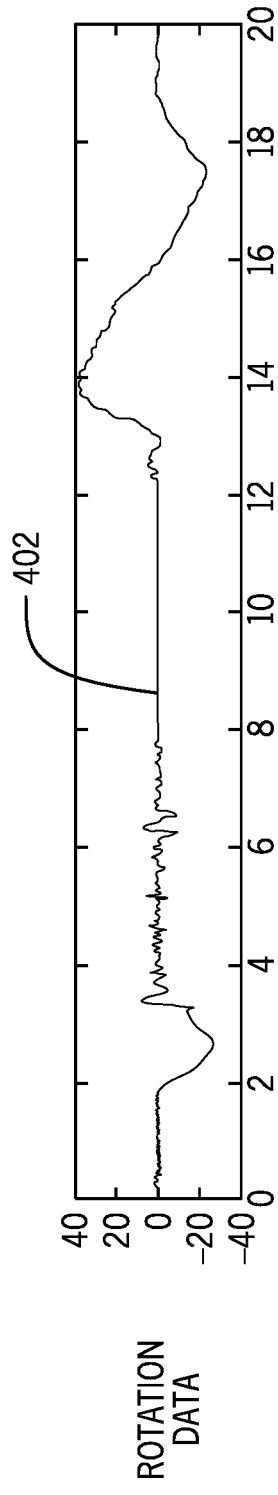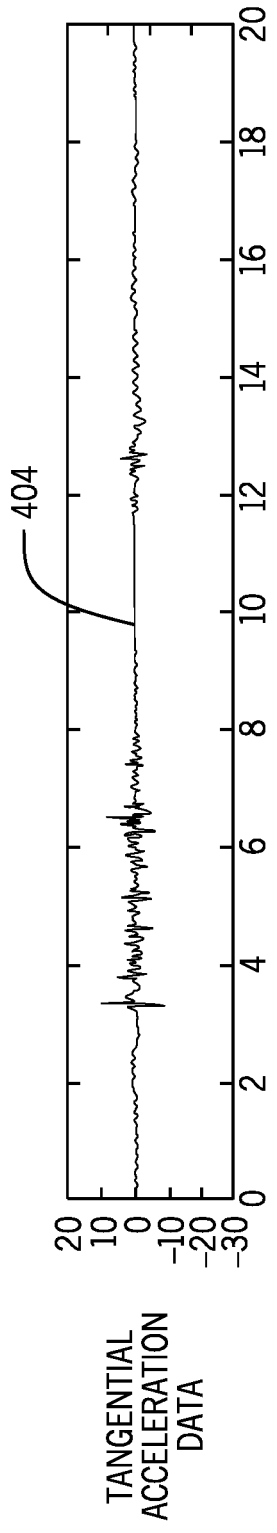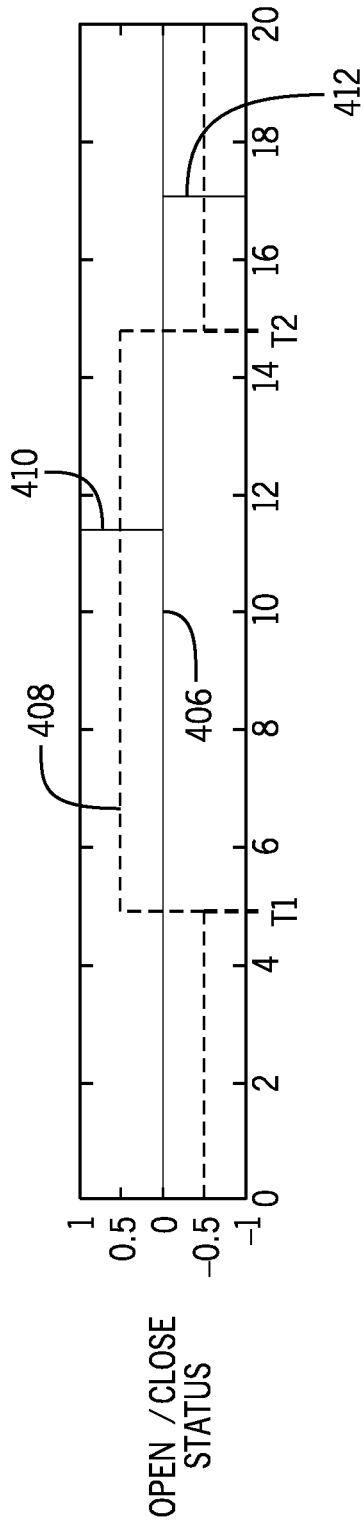

DETERMINING AN OPEN/CLOSE STATUS OF A BARRIER

CROSS-REFERENCE TO RELATED APPLICATION

This application claims the benefit under 35 U.S.C. § 119(e) of U.S. Provisional Patent Application No. 62/436,587, filed Dec. 20, 2016, which is hereby incorporated by reference.

BACKGROUND

Trucks, tractor-trailers, and tractors connected to chassis carrying containers can be used to transport cargo that includes goods. Trucks, trailers, and containers typically have doors that can be opened to allow access to cargo that is being transported, and closed to secure the items.

BRIEF DESCRIPTION OF THE DRAWINGS

Some implementations of the present disclosure are described with respect to the following figures.

FIG. 2 is a block diagram of a sensor device according to some examples.

FIGS. 4A-4C are graphs of various different data, according to some examples.

Throughout the drawings, identical reference numbers designate similar, but not necessarily identical, elements.

Figure 1A:
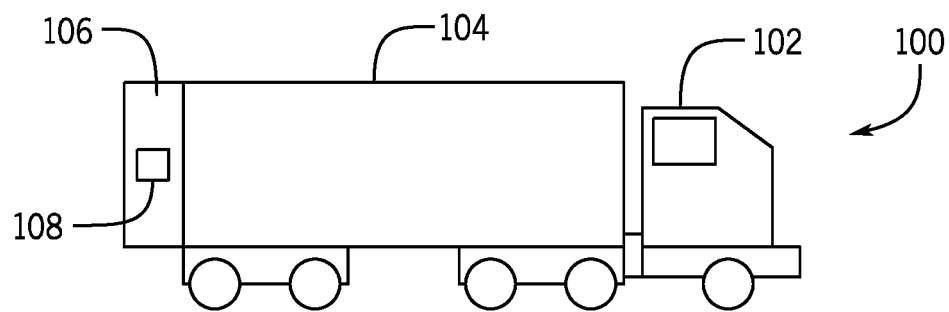
FIGS. 1A and 1B are schematic diagrams of a container hauled by a vehicle, the container including a door and a sensor device according to some examples mounted to the door.

The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION

In the present disclosure, use of the term "a," "an", or "the" is intended to include the plural forms as well, unless the context clearly indicates otherwise. Also, the term "includes," "including," "comprises," "comprising," "have," or "having" when used in this disclosure specifies the presence of the stated elements, but do not preclude the presence or addition of other elements.

A moveable platform can be used to carry physical items (such as cargo) between different geographic locations. Such moveable platforms can also be referred to as cargo transportation units (CTUs). For example, the moveable platform can be a container (that is attached to a tractor), a truck, or a trailer in which the physical items can be stored during shipment. In other examples, the moveable platform can include another type of carrier structure that is able to carry physical items. More generally, the moveable platform can be part of, mounted on, or attached to a vehicle, such as a truck, a tractor, a car, a railed vehicle (e.g., a train), a watercraft (e.g., a ship), an aircraft, a spacecraft, and so forth. It is noted that although the present discussion refers to a moveable platform as a container, techniques or mechanisms according to some implementations of the present disclosure are applicable to other cargo carrying platforms with an entry barrier that can be opened and closed.

The moveable platform can include a door through which physical items can be loaded or unloaded into or from an inner chamber of the moveable platform, respectively. The door is an example of an entry barrier (or more simply "barrier") that can be opened and closed. Other examples of barriers include a window or any other structure that can be opened to allow entry through an opening, or closed to block entry through the opening.

In some cases, it may be desirable to detect when the barrier is in an open state or in a closed state. Due to movement of the moveable platform on which the barrier is mounted, it is possible for the orientation of the moveable platform to change as the moveable platform is moved to different locations. For example, at a first location, the moveable platform can be located on a relatively flat ground surface. However, at a second location, the moveable platform can be located on a slope.

Because the potential movement of the moveable platform can cause the orientation of the moveable platform to change (e.g., an angle of the moveable platform with respect to a horizontal plane can change), it may be challenging to determine an open/close status of the barrier using a single sensor. The "open/close status" of a barrier can refer to a status that indicates whether the barrier is in an open position or a closed position.

In accordance with some examples, techniques or mechanisms are provided to allow for the determination of the open/close status of a barrier that can be opened and closed (i.e., that can be moved between an open position and a closed position) irrespective of the orientation. The barrier is mounted on a moveable platform that is moveable between different geographic locations.

Typically, door opening and closing on a moveable platform is determined by a contact sensor (e.g., a Hall effect sensor) such that when the door is opened or closed the state change (contact made or broken) is detected by the contact sensor and communicated to a sensor device. This approach involves wiring the contact sensor to the sensor device. Moveable platforms can be subjected to rough handling with heavy cargo, and as a result, the wires between the contact sensor and the sensor device can easily be cut. Moreover, the additional wiring and installation adds cost.

Figure 1B:
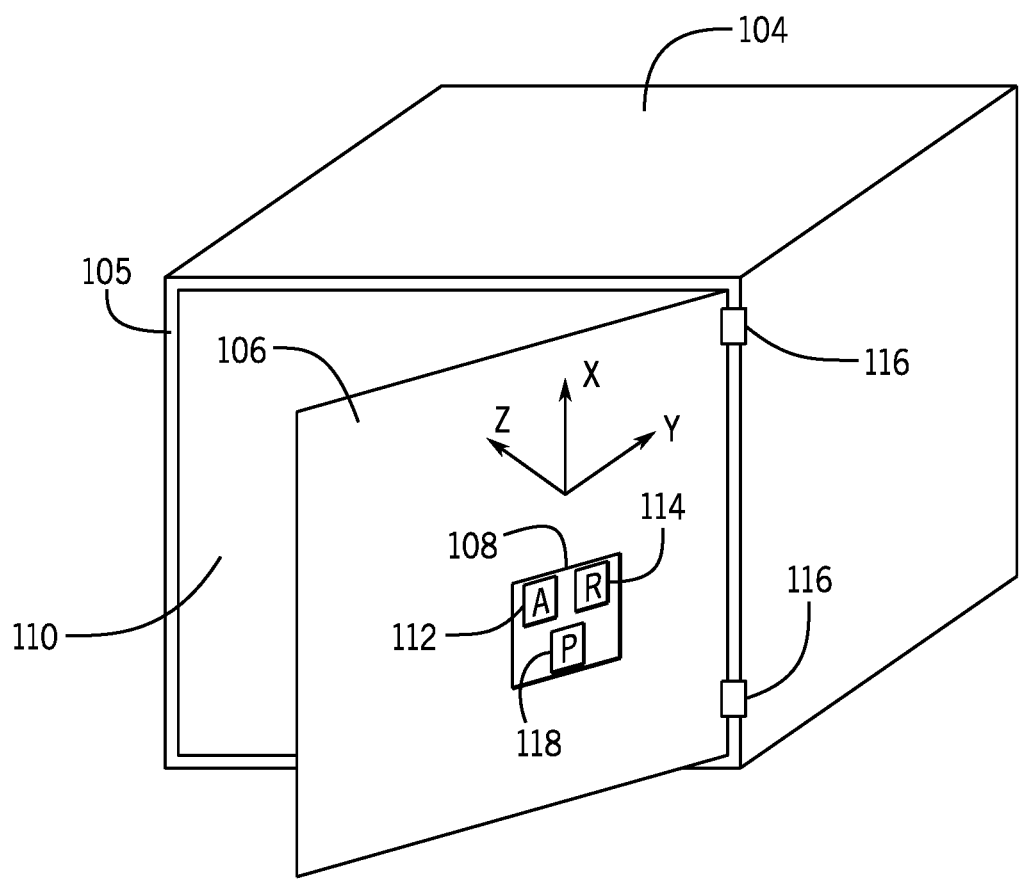

FIG. 1A illustrates an example truck 100 that includes a tractor unit 102 and a container 104 (provided on a chassis) hauled by the tractor unit 102. FIG. 1B is a perspective view of the container 104. The container 104 is an example of a moveable platform that can be used to carry physical items. The container 104 includes a door 106 that is pivotable between an open position and a closed position. In FIGS. 1A-1B, the door 106 is in the open position.

The door 106 is pivotally mounted on hinges 116, which are attached to a frame 105 (referred to as "door frame") of the container 104. The door 106 is able to rotate about the hinges 116 between the open position and the closed position. In FIG. 1A, two hinges 116 are shown. In other examples, the door 106 can be mounted on just one hinge, or on more than two hinges.

In accordance with some examples, a sensor device 108 is mounted to the door 106. The sensor device 108 can be mounted to an outer surface of the door 106 that faces the environment outside the container 104, or alternatively, the sensor device 108 can be mounted to an inner surface of the door 108 that faces into an inner chamber 110 of the container 104. In yet further examples, the sensor device 108 can be provided within a recess in the wall of the door 108.

The sensor device 108 can include sensors 112 and 114 and one or more processors 118. A processor can include any or some combination of the following: a microprocessor, a core of a multi-core microprocessor, a microcontroller, a programmable gate array, a programmable integrated circuit device, or another hardware processing circuit. Although the processor(s) 118 is depicted as being part of the sensor device 108 in some examples, it is noted that the processor(s) 118 can be separate from the sensor device 108 in other examples. More generally, sensors 112, 114 and the processor(s) 118 can either be integrated into the sensor device 108, such as on a circuit board or in an integrated circuit chip, or the sensors 112, 114 and the processor(s) 118 can be part of separate assemblies.

The sensor device 108 can also include a communication component to communicate over a network. In some examples, the sensor device 108 (along with other similar sensor devices arranged on barriers of other moveable platforms) can be part of a larger network of devices. This larger network of devices can be part of the "Internet-of-Things" (IoT) technology paradigm to allow different types of devices to communicate different types of data (including sensor data, voice data, video data, e-mail data, text messaging data, web browsing data, and so forth).

The ability of the sensor device 108 to communicate over a network can allow an entity (such as a distributor of goods, a manufacturer, or any other entity) to track assets of the entity as the assets are being transported throughout a geographic region.

In other examples, the sensor device 108 does not communicate data over a network.

Detecting the open/close status of the door 106 can be used to trigger various actions. For example, the sensor device 108 can send a notification (such as to a central service that is remotely located, or to the driver of the truck 100, or to another device on the truck 100) in response to detecting the door 106 in the open or closed position. Alternatively, the open/close status can be used to trigger measurement of other information (e.g., temperature, humidity, position of the container 104, or cargo load status, etc.), either by the sensor device 108 or by another sensor device. Other actions can be triggered by a detected open/close status in other examples.

The sensors of the sensor device 108 can include an accelerometer 112 and a rotation sensor 114. Although reference is made to an accelerometer or a rotation sensor in the singular sense, it is noted that techniques or mechanisms according to some implementations can be applied in other examples where there are multiple accelerometers and/or multiple rotation sensors that are part of the sensor device 108. The accelerometer 112 is used to measure acceleration along one or multiple axes, and can output acceleration data. The rotation sensor 114 is used to measure rotation about each of one or more axes. More specifically, the rotation sensor 114 can measure the rotation speed or rate of rotation about each respective axis.

In some examples, the rotation sensor 114 can include a gyroscope. In other examples, the rotation sensor 114 can include a rotation vector sensor, where a rotation vector produced by the rotation vector sensor represents the orientation of the rotation vector sensor as a combination of an angle and an axis, in which a device has been rotated through an angle around a specific axis.

Because the sensor device 108 is used to check the open/close status of a door that is mounted on a moveable platform, the rotation data from the gyroscope is used because comparing the acceleration data from the accelerometer against a threshold may not accurately determine the open/close status of the door, since the threshold that is used may not correspond to door movement depending upon the orientation of the frame (e.g., 105 in FIG. 1) on which the door is mounted. In other words, different thresholds may have to be used for different door frame orientations. Note also that parameters can be used for determining the open/close status of a door. Such parameters trained and learned for one door frame orientation may not be valid for a different orientation of the door frame.

Thus, according to some examples, since the door is mounted on a moveable platform whose position and orientation may change, the process for determining the open/close status of the door additionally uses rotation data from the gyroscope (or other rotation sensor) and further considers an orientation of the moveable platform.

Measurement data from the accelerometer can also be used to determine motion of the moveable platform.

In the ensuing discussion, reference is made to detecting the open/close status of a door, such as the door 106. It is noted that techniques or mechanisms according to some examples can be applied more generally to the detection of an open/close status of any type of barrier in other examples.

Sensor output can be noisy, where noise can come from a variety of different sources: mechanical vibration, electrical and thermal fluctuation, etc. As result, a processing technique to process sensor output for door status or motion status detection should account for the effect of noise for robust and accurate determination of door status or motion status.

A filter can be used to reduce noise in measurement data from a sensor device (e.g., 108 in FIGS. 1A and 1B). In a resource-constrained system like the sensor device 108 mounted on the moveable platform 104, it may be more desirable to use infinite impulse response (IIR) filters instead of finite impulse response (FIR) filters, since the storage load and computational complexity of IIR filters are typically lower than that of FIR filters.

An IIR filter can be described by using the following equation.

$$y[n] = \sum_{i=0}^{N} b_i x[n-i] + \sum_{j=1}^{M} a_j y[n-j],$$

where y[n] denote the filter output at time point n, x[n−i] denote the filter input at time point n−i, $b_i$ is called the i-th feedforward coefficient, and $a_j$ is called the j-th feedback coefficient. In the above, N is called the feedforward filter order and M is called the feedback filter order. When N=M=1 and $a_1+b_0=1$, a simple IIR filter can be defined by a single parameter $a_1$, $$y[n]=(1-a_1)x[n]+a_1 y[n-1].$$

Expanding the above equation, it is seen that for any $0<a_1<1$, the impact of x[n−i] on y[n] decreases exponentially as the time distance i from the time point n grows, i.e., $$y[n] = (1-a_1)x[n] + a_1 y[n-1]$$
$$= (1-a_1)x[n] + a_1(1-a_1)x[n-1] + a_1^2 y[n-2]$$
$$= (1-a_1)x[n] + a_1(1-a_1)x[n-1] + \ldots +$$
$$a_1^i(1-a_1)x[n-i] + a_1^{i+1}y[n-i-1].$$

Thus, a large impulse x[n] will have a longer impact on the filter output for a filter whose coefficient $a_1$ is large than for a filter whose coefficient $a_1$ is small. For this reason, a filter with a larger coefficient $a_1$ may be referred to as a long filter, and a filter with a smaller coefficient $a_1$ can be referred to as a short filter. Due to their respective constructions, note that:

a long filter is less sensitive to local changes than a short filter; and a short filter is faster to adapt to change in statistics than a long filter.

Stated differently, an impact of an input, x[n−i], at a previous time point on an output, y[n], of the long filter is greater than an impact of the input at the previous time point on an output of the short filter.

In accordance with some implementations of the present disclosure, door status detection systems and techniques can satisfy the following conditions C1 and C2. As explained further below, to address noisy measurement data from a sensor device, filters can be used that consider both conditions C1 and C2.

C1. A door status detection system or technique has to be fast and responsive so that the probability of missing a true door event is low; and C2. The door status detection system or technique is expected to be robust and reliable so that the probability of reporting a false event (falsely reporting a door as open when the door is closed, or falsely reporting the door as closed when the door is open) is low.

Note that door status detection is to be disabled when the moveable platform is detected to be in motion. As such, door status detection depends upon motion detection.

In practice, even when a door is in a closed position, it may be subject to environmental disruptions like strong winds. In addition, the moveable platform itself may be in harsh environments like an open sea where movement can be unpredictable. With these in mind, it is desirable to consider condition C2 in designing and developing solutions for door status detection.

In FIG. 1B, three axes are defined: X, Y, and Z. In the view of FIG. 1B, the X axis points generally upwardly, which in the view of FIG. 1B is generally parallel with a rotation axis of each hinge 116. The door 106 is rotatable about the rotation axis of the hinge 116. The Y axis is a radial axis that is perpendicular to the X axis (where the X axis is also referred to as a vertical or gravitational axis). In the view shown in FIG. 1B, the Y axis is parallel to the main surface of the door 106 and points towards the hinges 116. The Z axis (also referred to as a tangential axis) is in a direction that is normal to the main surface of the door 106; when the door 106 is in the closed position, the Z axis points into the inner chamber 110 of the container 104.

Although reference is made to the X axis as pointing upwardly in the view shown in FIG. 1B, it is noted that in other examples, the X axis can point in a different direction. More generally, the X axis is parallel to the rotation axis of a hinge about which the door 106 is rotatably mounted. Thus, in a different example, a hinge of the door 106 can be mounted such that its rotation axis extends along a horizontal axis, or along a diagonal axis. In other examples, rolling doors that move up and down do not have hinges but have rollers or other mechanisms to move up and down.

In some examples, the accelerometer 112 can measure acceleration along each of the X, Y, and Z axes, and the rotation sensor 114 can measure rotation data about each of the X, Y, and Z axes. In other examples, the accelerometer 112 can measure acceleration in a subset of the X, Y, and Z axes, such as along the X and Y axes, and the rotation sensor 114 can measure rotation data about just the X axis.

An example of the sensor device 108 is shown in FIG. 2. The sensor device 108 includes the accelerometer 112, the rotation sensor 114, and the one or more processors 118. The sensor device 108 can be implemented as a circuit board on which are mounted the accelerometer 112, the rotation sensor 114, and the processor(s) 118 plus associated memory and circuits, all housed in a suitable enclosure. In other examples, the sensor device 108 can be implemented as an integrated circuit chip with the accelerometer 112, the rotation sensor 114, and the processor(s) 118 plus associated memory and circuits, all housed in a suitable enclosure. In yet further examples, the processor(s) 118 can be separate from an assembly including the sensors 112 and 114.

The processor(s) 118 can receive acceleration data from the accelerometer 112, and rotation data from the rotation sensor 114.

The sensor device 108 further includes a storage medium 206 that stores a motion detection module 208 (which can include machine-readable instructions such as software or firmware) to detect motion of the moveable platform 104, and a door status detection module 210 (which can include machine-readable instructions such as software or firmware) to determine an open/close status of the door 106. Each of the motion detection module 208 and the door status detection module 210 is executable on the processor(s) 118. Although examples refer to the motion detection module 208 and/or the door status detection module 210 implemented as machine-readable instructions executable on processor(s), in other examples, the motion detection module 208 and/or the door status detection module 210 can be implemented with just a hardware processing circuit.

The motion detection module 208 uses the acceleration data from the accelerometer 112 to determine motion of the moveable platform 106 in accordance with some implementations of the present disclosure.

The door status detection module 210 uses the acceleration data from the accelerometer 112 and the rotation data from the rotation sensor 114 to determine the open/close status of the door 106.

A communication component 202 can transmit an output indication 204 to a destination over a data network. The output indication 204 can be in the form of a message, an information field in a message, or other indicator.

The output indication 204 can be a motion indicator to indicate whether or not the moveable platform 104 is in motion. For example, if the motion indicator is set to a first value, that indicates that the moveable platform 104 is in motion. However, if the motion indicator is set to a second value, that indicates that the moveable platform 104 is not in motion.

In further examples, the motion indicator is not output by the sensor device 108. Rather, the motion indicator is communicated by the motion detection module 208 to the door status detection module 210 for use by the door status detection module 210 in triggering a process to detect the open/close status of the door 106.

In additional examples, the output indication 204 can include an open/close status indicator to indicate whether the door 106 is open or closed. The open/close status indicator if set to a first value indicates that the door 106 is open, and if set to a second value indicates that the door 106 is closed.

The communication component 202 can include a wireless transceiver and associated circuits to allow for wireless communication by the sensor device 108 to the data network. The wireless communication can include wireless communication over a cellular access network, a wireless local area network, a satellite network, and so forth.

Alternatively, the communication component 202 can include a wired transceiver and associated circuits to perform wired communications between the sensor device 108 and the destination. More generally, the communication component 202 includes a communication transceiver and associated circuits.

The destination to which the output indication 204 is sent can include a server or a collection of servers and associated network equipment which may be located at one fixed location or in a mobile unit or as part of a data center or cloud.

In further examples, instead of communicating the output indication 204 to a destination device that is external of the sensor device 108, the output indication 204 can instead be used internally in the sensor device 108 to trigger an action, such as to cause other sensor(s) (not shown) of the sensor device 108 to measure one or more parameters or to take another action.

In the ensuing discussion, reference is made to examples where the rotation sensor 114 includes a gyroscope. In other examples, it is noted that techniques or mechanisms according to some implementations can be applied with other types of rotation sensors.

A gyroscope may consume a relatively large amount of power, in some cases greater than the power consumed by an accelerometer, for example. As such, it is desirable to maintain the gyroscope in a low power state, until the gyroscope is to be used for measuring rotation data. A low power state can refer to a state of the gyroscope where the gyroscope is powered off, or where some portion of the gyroscope is powered off to reduce power consumption by the gyroscope. The gyroscope can be activated to transition the gyroscope from the lower power state to an operational state, where the operational state of the gyroscope refers to a state of the gyroscope where the gyroscope can measure rotation data and output the rotation data.

Figure 3A:
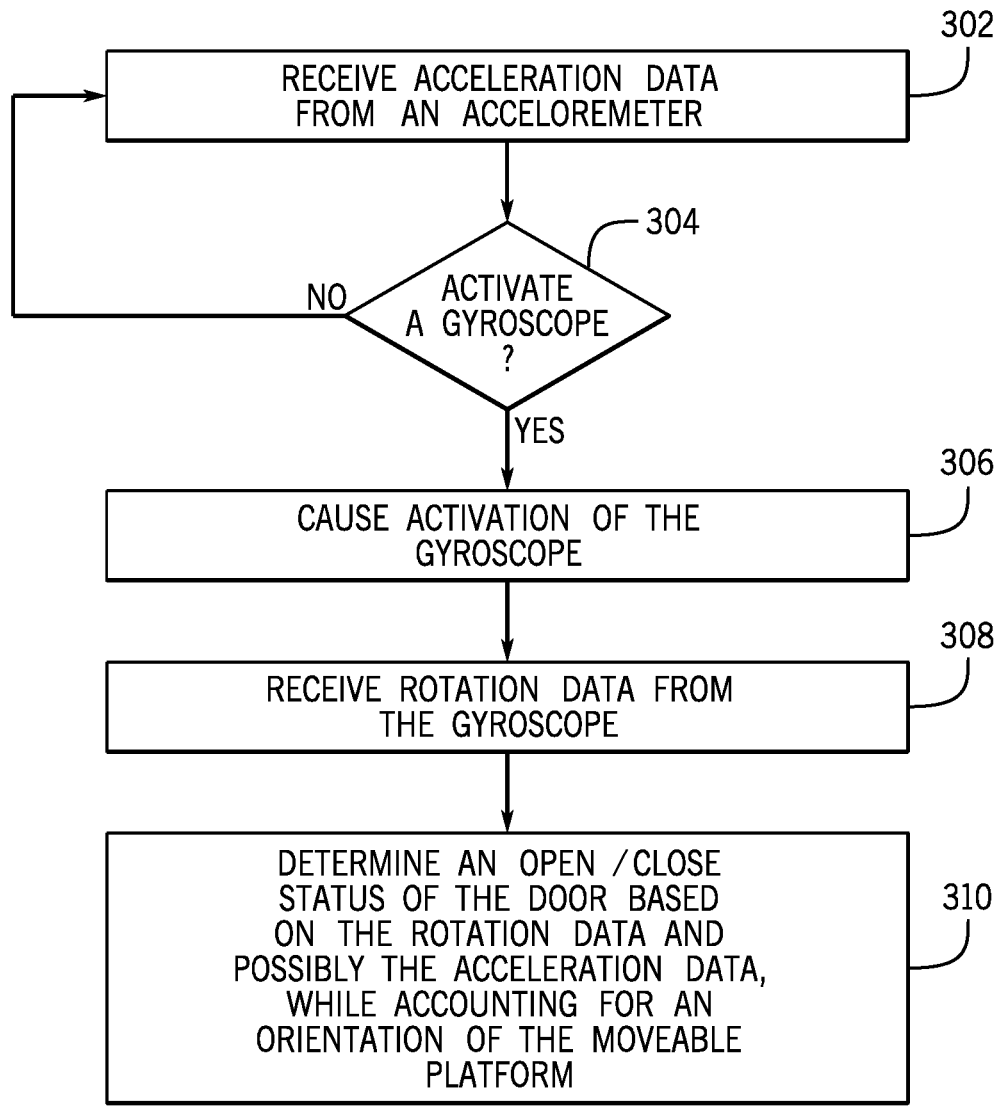
FIG. 3A is a flow diagram of a process to determine an open/close status of a door that can be pivoted between an open position and a closed position, according to some examples where filters are not used to filter measurement data from a sensor device.

FIG. 3A is a flow diagram of a general door open/close (DOC) process of determining an open/close status of a door (e.g., the door 106) mounted on a moveable platform (e.g., the container 104). The DOC process of FIG. 3A does not use filters to filter measurement data from the sensor device 108.

The DOC process of FIG. 3A can be performed by a computing device, such as by the processor(s) 118 according to some examples. The DOC process of FIG. 3A can receive (at 302) acceleration data from an accelerometer, such as the accelerometer 112 that is part of the sensor device 108 mounted on the door. The DOC process can determine (at 304) whether to activate a gyroscope (e.g., 114 in FIG. 1B or 2) based on the acceleration data from the accelerometer, where activating the gyroscope refers to transitioning the gyroscope from the low power state to the operational state.

If the gyroscope is not to be activated, then the DOC process can continue to receive further acceleration data from the accelerometer. However, if it is determined that the gyroscope is to be activated, then the DOC process can cause activation (at 306) of the gyroscope. The DOC process receives (at 308) rotation data from the activated gyroscope.

The DOC process of FIG. 3A further includes determining (at 310) an open/close status of the door based on the rotation data from the gyroscope (and possibly also on the acceleration data from the accelerometer). It is noted that the determined open/close status of the door also accounts for the orientation of the moveable platform on which the door is mounted, where the orientation can change as a result of the moveable platform moving to different locations.

In some implementations, the DOC process can be disabled when the moveable platform is detected to be in motion. Detecting motion of the moveable platform can be based on any or some combination of the following: the acceleration data from the accelerometer 112, based on positioning information from a global positioning system (GPS) receiver, based on speed information provided by the vehicle, and so forth. In response to detecting that the moveable platform is in motion, the DOC process deactivates determination of the open/close status of the door.

Although rotation data from the gyroscope can detect door opening with relatively high reliability, detecting door closing is analogous to proving a negative. As a result, the DOC process according to some implementations can use both the rotation data from the gyroscope and the acceleration data from the accelerometer under certain conditions to improve reliability in detecting door closing.

In further examples, a DOC process (that does not use filters to filter measurement data from the sensor device 108) can follow the procedure below.

S1. Monitor the tangential component (along the Z axis) of the acceleration data (hereinafter referred to as the "tangential acceleration data") from the accelerometer. If a substantial jump in the tangential acceleration data is detected (based on determining if a variance of the tangential acceleration data satisfies specified conditions G1 and G2 as discussed further below), the procedure continues to S2.

S2. Activate the gyroscope to track the angle movement around the X axis (vertical or gravitational axis).
  a. If the angle movement is away from the door frame and the turned angle is large enough (e.g., as determined according to FIG. 7 discussed further below), a door open event is reported;

b. If the angle movement is small, the procedure continues to S3.

S3. Check if the tangential acceleration data of the acceleration is stable and close to a bias trained when the door is closed and at a stationary position (e.g., as determined according to FIG. 7). If the answer is yes, a door close event is reported.

As noted above, to compensate for noisy measurements from a sensor, such as the accelerometer 112, a filter, such as an IIR filter, can be applied. A filter can be used to filter acceleration data from the accelerometer 112 during both a training process (to train the system or technique for detecting the open/close status of a barrier) and a detection process (to detect the open/door status of a barrier). However, use of a single filter, such as a single IIR filter, may not adequately address conditions C1 and C2 above.

To meet condition C1, a short filter may be preferred. However, to meet condition C2, a long filter may be preferred. As a result, if just one IIR filter is used, a dilemma may arise in selecting an optimal IIR filter to address conditions C1 and C2, which can result in a trade-off between a door status detection solution that is fast and responsive or that is robust and reliable.

In accordance with some implementations of the present disclosure, a DOC process can determine an open/close status of a door (or other pivotable barrier) on a moveable platform based on selective use of a plurality of different filters (e.g., selective use of a short filter and a long filter) for filtering measurement data from a sensor device (e.g., 108 in FIG. 1B or 2).

Figure 3B:
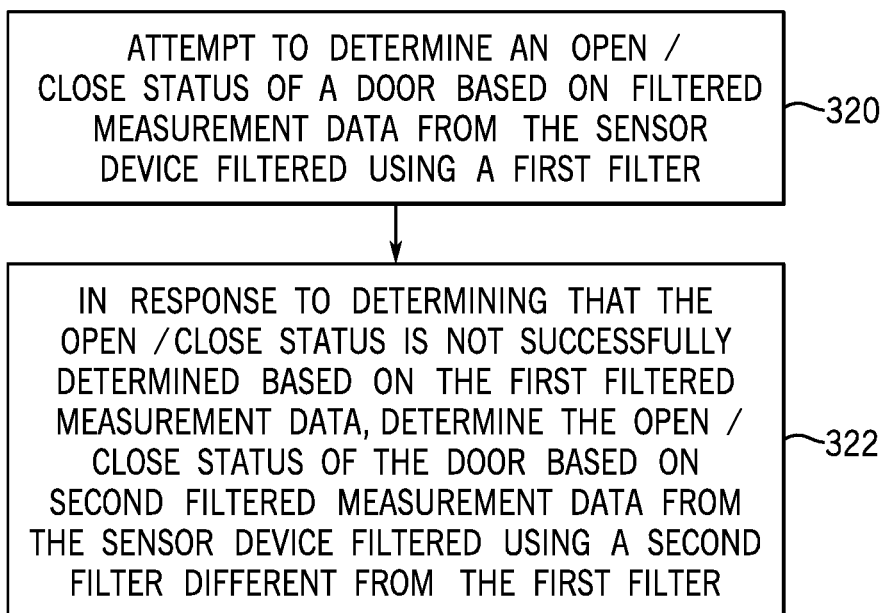
FIG. 3B is a flow diagram of a process to determine an open/close status of a door that can be pivoted between an open position and a closed position, according to further examples where multiple filters are used to filter measurement data from a sensor device.

As shown in FIG. 3B, the DOC process according to some implementations can attempt (at 320) to determine an open/close status of the door based on first filtered measurement data from the sensor device filtered using a first filter (e.g., the short filter). In response to determining that the open/close status is not successfully determined based on the first filtered measurement data, the DOC process determines (at 322) the open/close status of the door based on second filtered measurement data from the sensor device filtered using a second filter (e.g. the long filter) different from the first filter.

The following assumes that the accelerometer 112 is a three-axis accelerometer that can measure acceleration data in each of the X, Y, and Z axes, and that the gyroscope 114 is a three-axis gyroscope that can measure rotation data about each of the X, Y, and Z axes. However, in other examples, the accelerometer 112 and the gyroscope 114 can measure respective measurement data for a smaller number of axes. For example, the accelerometer can measure acceleration data along only the Y and Z axes, and the gyroscope can measure rotation data about only the X axis.

The acceleration data from the accelerometer 112 includes radial acceleration data (along the Y axis), tagential acceleration data (along the Z axis), and gravitational acceleration data (along the X axis), which are denoted respectively by $r_1 r_2 \ldots$ (radial acceleration data), $t_1 t_2 \ldots$ (tangential acceleration data), and $v_1 v_2 \ldots$ (gravitational acceleration data). The rotation data from the gyroscope 114 includes rotation data about the X axis, Y axis, and Z axis, which are denoted $g_{x,1} g_{x,2} \ldots, g_{y,1} g_{y,2} \ldots,$ and $g_{z,1} g_{z,2} \ldots,$ respectively.

The gyroscope is to remain inactive until it is activated. In some implementations, once activated, the gyroscope can operate for a specified time duration, during which the gyroscope is able to measure rotation data. In response to expiration of the specified time duration, the gyroscope is deactivated to reduce power consumption.

The output of the DOC process includes an open/close indication $e_i$ at time point i, where $e_i$ can be set by the DOC process to one of multiple different values, such as:

$e_i$=0 indicates no door movement, $e_i$=1 indicates door closing movement (door closed status), and $e_i$=−1 indicates door opening movement (door open status).

Although specific values of $e_i$ are provided above, it is noted that in other examples, $e_i$ can be set to different values to indicate different door status.

A door opening movement is characterized by the door opening by at least a specified angle (e.g., 8°, 10°, etc.) during the specified duration of operation of the gyroscope, in response to a detectable force.

A door closing movement is characterized by the door hitting the door frame with a detectable force and remaining stationary at the door frame for at least a second time duration, such as a fractional end portion of the specified time duration of operation of the gyroscope.

In some examples, the DOC process outputs a sequence $e_1 e_2 \ldots, e_N$, where N>1, for respective time points 1, 2, . . . , N, and each $e_i$ at time point i can have one of the three example values noted above.

The accelerometer and gyroscope can be sampled at the same frequency $f_s$, such as 50 Hertz (Hz) or a different frequency.

FIGS. 4A-4C are three graphs that depict rotation data (FIG. 4A), tangential acceleration data (FIG. 4B), and the open/close status (FIG. 4C) as a function of time. A curve 402 in FIG. 4A depicts gyroscope rotation data about the X axis at respective time points. A curve 404 in FIG. 4B represents tangential acceleration data about the Z axis from the accelerometer at respective time points. A curve 406 represents a result of the open/close determination performed by the DOC process according to some examples. FIG. 4C also shows a ground truth curve 408 that indicates the actual open/close status of the door. The ground truth curve 408 being below value zero indicates that the door is closed, while the ground truth curve 408 being below zero indicates that the door is closed. As indicated by the ground truth curve 408, the door starts in the closed position, is moved to the open position, and is then moved to the closed position. In the example shown in FIG. 4C, as indicated by the ground truth curve 408, a door opening sequence is centered at time T1, while a door closing sequence is centered at time T2.

An upward spike 410 of the curve 406 in FIG. 4C indicates a door open status, while a downward spike 412 of the curve 404 indicates a door close status.

In general, the DOC process according to some examples of the present disclosure includes two sub-processes: (1) determining whether to activate the gyroscope based on the acceleration data from the accelerometer, and (2) determining the open/close status of the door based on the gyroscope data and possibly the acceleration data.

Triggering Activation of the Gyroscope

The following describes the sub-process in the DOC process for triggering activation of the gyroscope 114, based on acceleration data from the accelerometer 112. Generally, in some examples, the triggering of the activation of the gyroscope can be based on a variance of the acceleration data. Variance can refer to the expectation of the squared deviation of a random variable (in this case acceleration data) from its mean. The DOC process can determine whether the computed variance satisfies one or more conditions, and if so, that is an indication that the door may be moving and thus the gyroscope should be activated to perform the determination of the open/close status of the door.

For simplicity, in the following discussion, it is assumed that the DOC process uses just the tangential acceleration data $t_1 t_2 \ldots$ (along the Z axis) from the accelerometer to determine whether the gyroscope is to be activated or not. In other examples, the acceleration data along one or more of the X axis and Y axis can be used to determine whether the gyroscope is to be activated or not.

At time point i, the DOC process computes a gyroscope activation indication, $gi_i$, as follows:

$gi_i=1$ indicates that the gyroscope is to be activated; and
$gi_i=0$ indicates that the gyroscope is not to be activated.

Although specific values for $g_i$ are noted above, it is contemplated that the gyroscope activation indication $g_i$ can have other values in other examples for indicating whether or not the gyroscope is to be activated.

Figure 5:
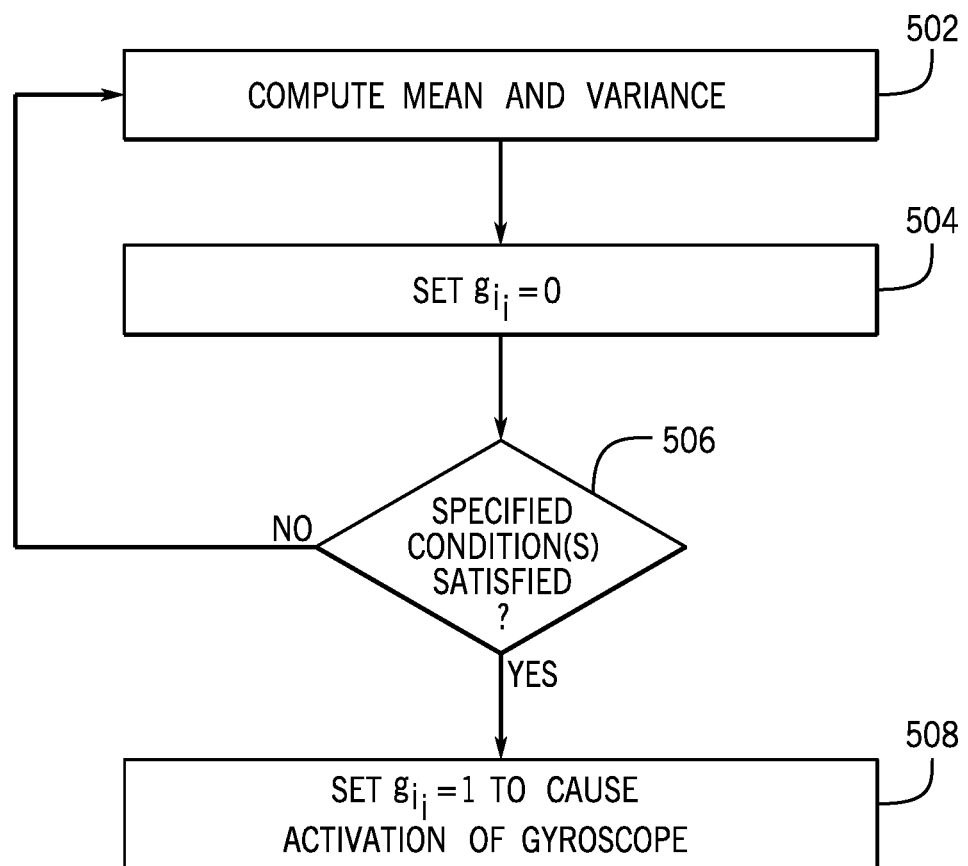
FIG. 5 is a flow diagram of a process to trigger activation of a rotation sensor, according to some examples.

FIG. 5 is a flow diagram of an example process to control activation of the gyroscope that is initially in a low power state. The process of FIG. 5 can be performed by the processor(s) 118 of FIGS. 1B and 2, or by a different computing device. In the following discussion, $\mu_{t,i}$ represents the mean of the tangential acceleration data $t_1 t_2 \ldots$ at each time point i, while $\sigma_{t,i}^2$ represents the variance of the tangential acceleration data $t_1 t_2 \ldots$ at each time point i. The process of FIG. 5 computes (at 502) the mean and variance parameters ($\mu_{t,i}$, $\sigma_{t,i}^2$) according to:

$$\mu_{t,i} = \frac{S_{t,i}}{K}, \quad \text{(Eq. 1)}$$

$$\sigma_{t,i}^2 = \frac{S_{t^2,i}}{K} - \mu_{t,i}^2, \quad \text{(Eq. 2)}$$

where $$S_{t,i} = \sum_{j=i-K+1}^{i} t_j, \quad \text{(Eq. 3)}$$

$$S_{t^2,i} = \sum_{j=i-K+1}^{i} t_j^2. \quad \text{(Eq. 4)}$$

In Eqs. 1-4, the parameter K is a specified constant value that represents a time window size in terms of number of samples (at respective time points) of the tangential acceleration data over which the respective mean and variance are computed, where each sample is collected at a respective time point.

More generally, Eq. 3 sums the tangential acceleration data $t_1 t_2 \ldots$ from time point $j=i-K+1$ to a current time point i to compute $S_{t,i}$, and Eq. 4 sums the square of the tangential acceleration data $t_1 t_2 \ldots$ from time point $j=i-K+1$ to a current time point i to compute $S_{t^2,i}$. The values $S_{t,i}$ and $S_{t^2,i}$ are used in Eqs. 1 and 2, respectively, to compute the mean $\mu_{t,i}$ and the variance $\sigma_{t,i}^2$.

The process sets (at 504) $gi_i=0$ (gyroscope inactive).

The process determines (at 506) if one or more of specified conditions G1 and G2 are satisfied, where $$\sigma_{t,i}^2 > C_1 \sigma_{t,i-K}^2, \quad \text{Condition G1:}$$

$$\sigma_{t,i}^2 > C_2. \quad \text{Condition G2:}$$

Condition G1 relates to whether the variance $\sigma_{t,i}^2$ computed according to Eq. 2 is greater than $C_1 \sigma_{t,i-K}^2$, where $C_1$ is a specified constant value. Condition G1 includes a comparison of a current variance $\sigma_{t,i}^2$ at time point i with a value based on a product of the constant $C_1$ and the variance $\sigma_{t,i-K}^2$ computed at the beginning of the time window at i-K.

Condition G2 relates to a determination of whether a current variance $\sigma_{t,i}^2$ at time point i is greater than a threshold $C_2$, which is a specified constant value.

In the foregoing computations, the constants $C_1$ and $C_2$ are used to determine if the force used to generate tangential movement is significant enough in that it may be due to door opening or closing. The values of K, $C_1$, and $C_2$ can be empirically set based on past experience and the specific characteristics of the sensor device and the door whose open/close status is to be determined. In some examples, K=25, C1=16, and C2=0.6. However, in other examples, other values of K, $C_1$, and $C_2$ can be used. For example, $C_2$ may be determined by statistics, e.g., variance, from accelerometer readings from other axes, e.g., the X axis, the Y axis, or a combination of both X and Y axes. Note that the variance of acceleration along the X axis is often used to determine whether the platform on which the door is mounted, e.g., a container or a trailer, is moving or not. $C_2$ as a function of the variance of acceleration along the X axis essentially indicates that G2 is conditioned upon the movement of the platform.

If either condition G1 or G2 is satisfied, then the process sets (at 508) $gi_i=1$, to cause activation of the gyroscope. However, if neither condition G1 nor G2 is satisfied, then the process maintains $gi_i=0$ and returns to task 502.

In further examples, in task 502, the variance $\sigma_{t,i}^2$ may be multiplied by $$\frac{K}{K-1}$$

to obtain an unbiased sample variance. Furthermore, $S_{t,i}$ in Eq. 3 may be efficiently computed from $S_{t,i-1}$ by using the following equation.

$$S_{t,i} = S_{t,i-1} - t_{i-K} + t_i. \quad \text{(Eq. 5)}$$

Similarly, $S_{t^2,i}$ in Eq. 4 may be efficiently computed from $S_{t^2,i-1}$ by using $$S_{t^2,i} = S_{t^2,i-1} - t_{i-K}^2 + t_i^2. \quad \text{(Eq. 6)}$$

In alternative examples, $\mu_{t,i}$ and $\sigma_{t,i}^2$ in task 502 may be approximated by using IIR filters. Let $\alpha$ denote an IIR filter parameter. Then $$\bar{\mu}_{t,i} = (1-\alpha)\bar{\mu}_{t,i-1} + \alpha t_i, \quad \text{(Eq. 7)}$$

$$\bar{S}_{t,i} = (1-\alpha)\bar{S}_{t,i-1} + \alpha t_i^2, \quad \text{(Eq. 8)}$$

$$\bar{\sigma}_{t,i}^2 = \bar{S}_{t,i} - \bar{\mu}_{t,i}. \quad \text{(Eq. 9)}$$

In such alternative examples, the FIG. 5 process can be modified to use the variance $\bar{\sigma}_{t,i}^2$ computed according to Eq. 9 rather than the variance $\sigma_{t,i}^2$ computed according to Eq. 2.

Also, tasks 506 and 508 can be modified to detect if conditions G1 and G2 are consistently met over a number of consecutive samples to reduce false positives. In other words, rather than set $gi_i=1$ when condition G1 or G2 is satisfied for time point i, the setting of $gi_i=1$ is based on whether the condition G1 or G2 is also satisfied over the next number of time points. In the case where IIR filters are used, the threshold on the number of samples over which conditions G1 and G2 are evaluated may be adaptive to $\sigma_{t,i}^2$—the larger $\sigma_{t,i}^2$ is observed, the higher the threshold is, reflecting the fact that the IIR filters have longer tails for larger values.

Detecting Open/Close Status of the Door

The following process describes how the open/close status of the door is determined, based on rotation data from the gyroscope. It is noted that in some cases, the closed status of the door may not be determined with just the rotation data; in such cases, acceleration data would also be used.

Once the gyroscope is triggered at time point i in response to setting $gi_i=1$ (task 508 in FIG. 5), the gyroscope remains active for a specified time duration (e.g., three seconds or some other time duration). The reason that the gyroscope stays on for the specified time duration is to ensure that the gyroscope returns to a low power state after the rotation data measurements have been made in the specified time duration. In some examples, at a sampling frequency $f_s=50$ Hz, assuming a three-second time duration when the gyroscope is activated, a total of 150 rotation data samples from the gyroscope are collected for use in detecting door opening and closing. In other examples, different time durations and different sampling frequencies can be used.

Figure 6:
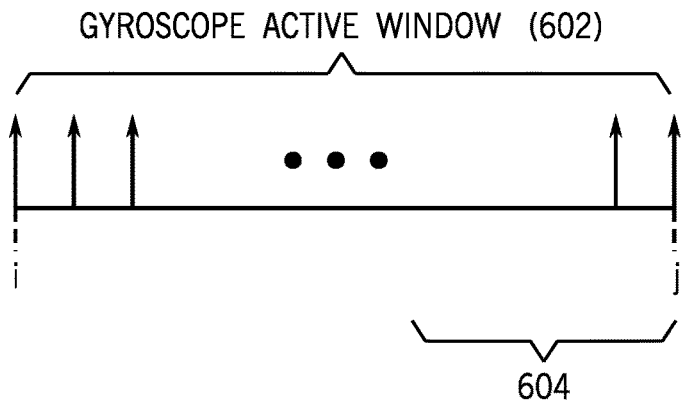
FIG. 6 is a graph of a gyroscope active window according to some examples.

In the ensuing discussion, the time duration during which the gyroscope is activated to collect rotation data is referred to as the "gyroscope active window," shown as 602 in FIG. 6. In FIG. 6, each upwardly pointing arrow represents a rotation data sample collected at a respective time point by the gyroscope.

Since door movement in some examples involves rotation along the X axis, the DOC process uses just the gyroscope's rotation data about the X axis, $g_{x,i}g_{x,i+1} \ldots g_{x,i+149}$ (assuming that 150 samples of rotation data are collected in the gyroscope active window 602).

Let $j=i+149$, where j represents the end of the gyroscope active window 602, and i represents the beginning of the gyroscope active window. The DOC process computes the open/close indication $e_j$ based on rotation data samples $g_{x,i}g_{x,i+1} \ldots g_{x,j}$ (from time point i to time point j) according to the process shown in FIG. 7. As noted above, the open/close indication $e_j$ can be set to one of three values (−1 to indicate door open, 1 to indicate door close, and 0 to indicate otherwise).

Figure 7:
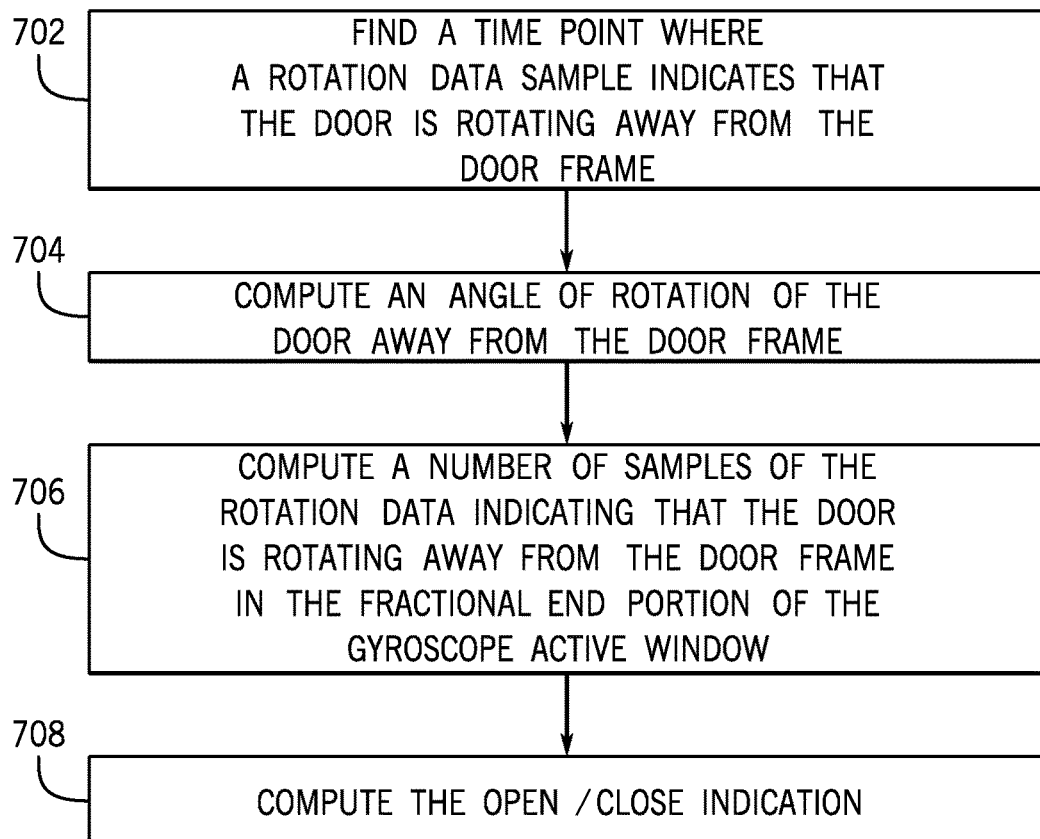
FIG. 7 is a flow diagram of a process to compute an open/close status of a door according to examples where filters are not used to filter measurement data from a sensor device.

Note that the process of FIG. 7 does not use filters to filter measurement data from the sensor device 108.

Task 702: In some examples, the process finds the smallest time point k (in the time range from time point i to time point j) where a rotation data sample $g_{x,k}$ indicates that the door is rotating away from the door frame (e.g., 105 in FIG. 1B). Note that the door is rotating away from the door frame if $g_{x,k}>0$. Stated differently, this task involves finding the index k such that $g_{x,k}\geq 0$, $i\leq k\leq j$, and denoting this smallest index k by k*. If no such k exists, set $k^*=j+1$.

In other examples, instead of finding the smallest time point k, the process may choose, for example, to save computational complexity, to find a time point k where a rotation data sample $g_{x,k}$ indicates that the door is rotating away from the door frame.

Task 704: The process computes an angle of rotation of the door away from the door frame by computing an approximate integration of the rotation data samples from the gyroscope, in the time range from time point k* to time point j. The approximate integration of the rotation data is computed as $a_j=\Sigma_{k=k^*}^{j} g_{x,k}$, if If $k^*\leq j$, $a_j=0$ if $k^*>j$.     (Eq. 10)

In Eq. 10 above, $a_j$ is produced by aggregating (e.g., summing) the rotation data samples, which produces an aggregate value, $a_j$, that represents an approximation of the rotation angle of movement of the door (i.e., how many degrees the door has rotated about the X axis).

Task 706: The process computes a number of samples of the rotation data ($g_{x,k}$) indicating that the door is rotating away from the door frame, in a fractional end portion (604 shown in FIG. 6) of the gyroscope active window 602. In the case of a door close event, the number of samples of the rotation data indicating that the door is opening in the fractional end portion 604 should be less than some specified threshold. Even when the door has hit the door frame when being closed, vibration of the door due to the elasticity of the door can cause some rotation data samples in the fractional end portion 604 of the gyroscope active window 602 to be greater than zero (to indicate movement away from the door frame). More specifically, this number of samples of the rotation data indicating that the door is opening in the fractional end portion 604 is expressed as $n_j=|\{k:|g_{x,k}|>0.2, j-f_s/2\leq k\leq j\}|.$     (Eq. 11).

In Eq. 11, $j-f_s/2\leq k\leq j$ corresponds to the duration of the fractional end portion 604, which starts at $j-f_s/2$ and ends at j.

Task 708: The process computes the open/close indication $e_j$ as follows.
$e_j=-1$ if $a_j>C3$,
$e_j=1$ if $a_j<C4$ and $n_j\leq C5$,
$e_j=0$ otherwise The open/close indication $e_j$ is computed based on comparing the angle of rotation of the door away from the door frame ($a_j$) with respect to thresholds C3 and C4, and based on comparing $n_j$ to the threshold C5.

The parameters C3, C4, and C5 are specified constants. The parameter C3 represents a threshold amount of rotation angle (e.g., 8°, 10°, etc.) that the door has to rotate in a direction away from the door frame to indicate that the door has moved to the open position. For example, C3 is set to 8 to indicate 8°, set to 10 to indicate 10°, and so forth. Thus, $a_j>C3$ indicates that the door has rotated away from the door frame by more than C3 degrees.

The parameter C4 represents a threshold amount of rotation angle (e.g., 3°, etc.) that $a_j$ should be less than to indicate that the door has possibly moved to the closed position.

Thus, generally, the DOC process determines that the door has moved to the open position in response to the aggregate value, $a_j$, having a specified relation with respect to a first threshold (e.g., $a_j>C3$). The DOC process determines that the door has moved to the closed position in response to the aggregate value, $a_j$, having a specified relationship with respect to a second threshold (e.g., $a_j<C4$), and further based on another condition that confirms the door closed status (e.g., $n_j\leq C5$).

The parameter C5 (e.g., 2, etc.) represents a threshold number of samples of rotation data exceeding zero (to indicate rotation away from the door frame) used to confirm a door close event. Thus, $n_j\leq C5$ specifies that the number of samples of rotation data indicating that the door is opening in the fractional end portion 604 is less than or equal to C5. More generally, $n_j$ is a stationary indication value (a bias) for indicating whether the door is stationary (e.g., $n_j\leq C5$ indicates that the door is stationary). If both $a_j<C4$ and $n_j\leq C5$ are true, then a door close status is confirmed, and $e_j$ is set to 1.

However, if $a_j<C4$ but $n_j>C5$, the door may still be in the middle of a closing sequence before stopping. In view of this, the DOC process can continue checking (for up to 5 seconds or another time duration, for example) if the tangential acceleration data $t_{j+1}t_{j+2} \ldots$, and the radial acceleration data $r_{j+1}r_{j+2} \ldots$ converge to stationary values estimated when the door is still and closed. If convergence of the tangential acceleration data and the radial acceleration data is detected at time point j'>j, then the DOC process sets $e_j=1$.

Thus, a determination of a closed status of the door under the condition that $a_j<C4$ but $n_j>C5$ is based on the rotation data from the gyroscope and a determined convergence that is based on the orientation of the moveable platform on which the door is mounted. More specifically, the determination of the closed status of the door is based on the rotation data and convergence of the acceleration data that is based on the orientation of the moveable platform.

The convergence of tangential acceleration data and radial acceleration data is discussed further below.

Use of IIR Filters for Door Open/Close Status Detection

Figure 8A:
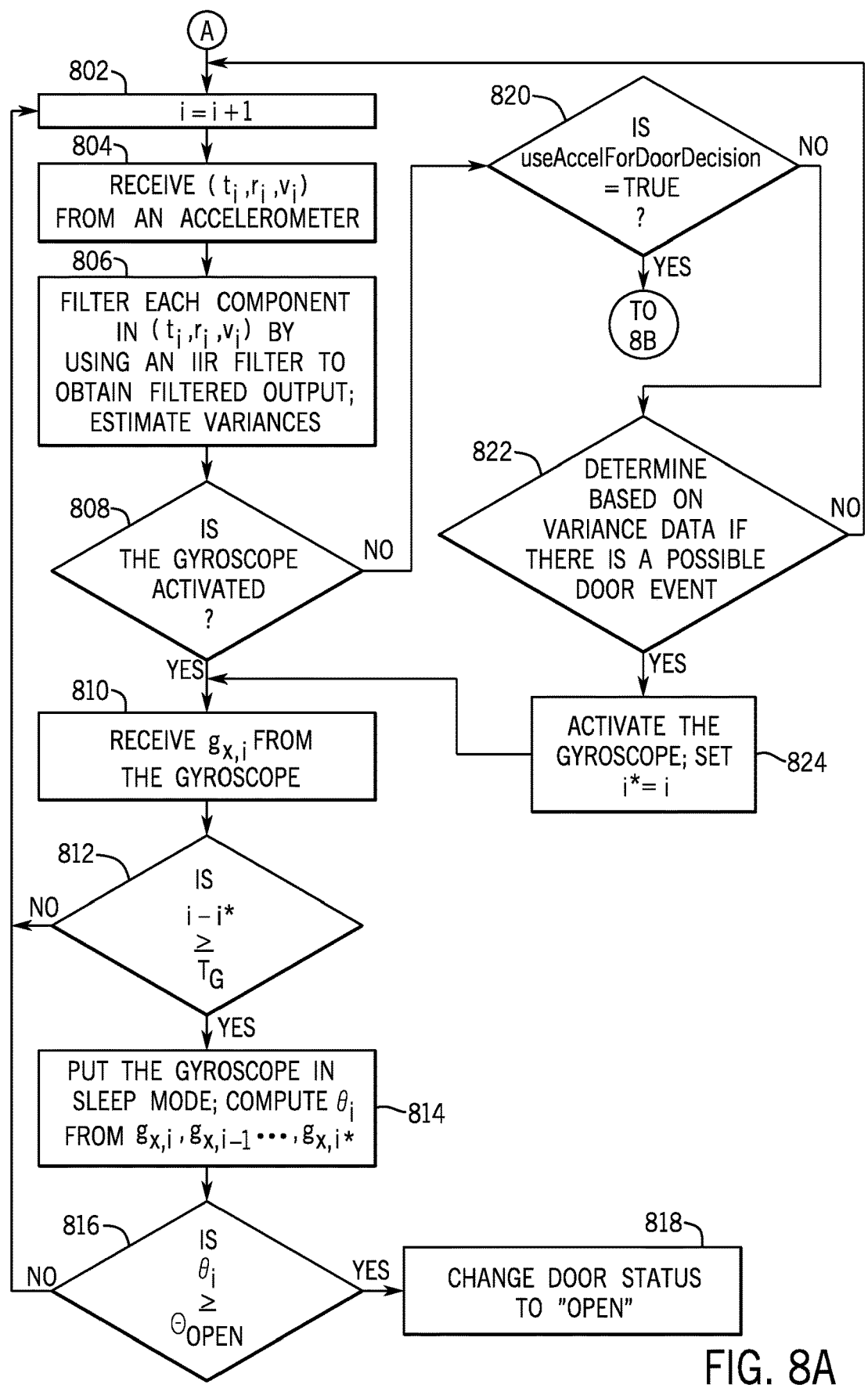
FIGS. 8A-8B are a flow diagram of determining an open/close status of a door using a single filter, according to further examples.
Figure 8B:
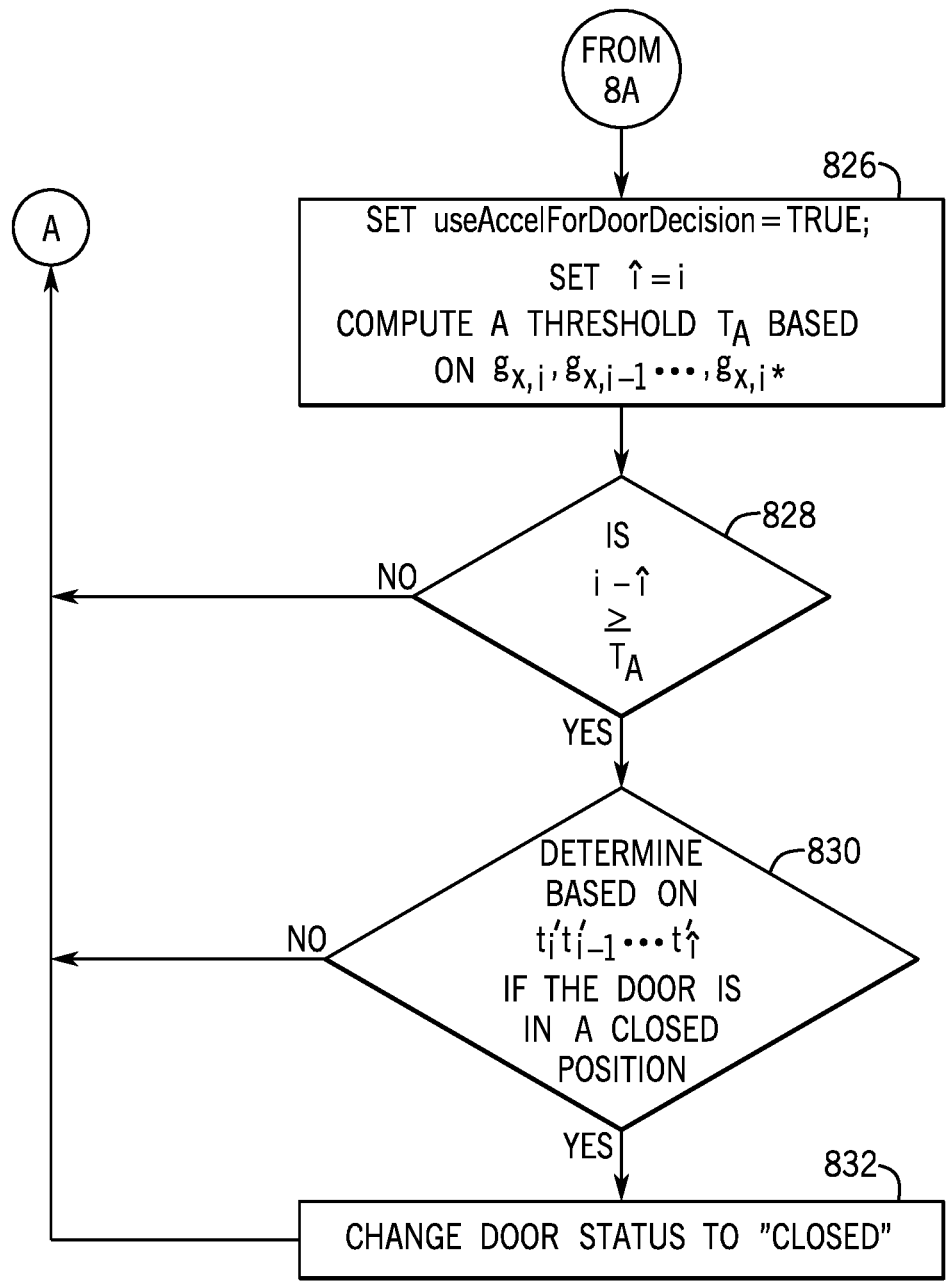

To compensate for noise in measurement data from the acceleration data when determining the open/close status of a barrier, FIGS. 8A-8B illustrate a procedure according to examples where just one IIR filter is used. Note that the biases used in determining whether the door is closed or not based on tangential acceleration data are learned by using learning techniques discussed further below.

As noted above, use of just one IIR filter may not adequately satisfy both conditions C1 and C2 discussed further above.

FIGS. 8A-8B depict an iterative procedure that iterates over multiple time points i.

Task 802: The procedure increments time point i.

Task 804: The procedure receives acceleration data ($t_i$, $r_i$, $v_i$) from the accelerometer.

Task 806: The procedure filters each component in the acceleration data ($t_i$, $r_i$, $v_i$) by using the IIR filter to obtain filtered output including filtered acceleration ($t'_i$, $r'_i$, $v'_i$). Variances ($\sigma_{t,i}^2$, $\sigma_{r,i}^2$, $\sigma_{v,i}^2$) are estimated based on the acceleration data ($t_i$, $r_i$, $v_i$).

Task 808: The procedure determines if the gyroscope is activated.

Task 810: If the gyroscope is activated, the procedure receives rotation data $g_{x,i}$ (rotation data about the X axis at time point i) from the gyroscope.

Task 812: The procedure determines if the elapsed time (i–i*) is greater than or equal to $T_G$, which represents the time duration during which the gyroscope is activated before placing the gyroscope to sleep. The parameter i* represents the time point at which the gyroscope was activated. In some examples, $T_G$ can be set to $3f_s$, i.e., three times the sampling frequency $f_s$, which is equivalent to 3 seconds. In other examples, other values of $T_G$ can be used. If the elapsed time (i–i*) is not greater than or equal to $T_G$, then the process increments i (task 802) and continues to receive additional acceleration and rotation data.

Task 814: If the elapsed time (i–i*) is greater than or equal to $T_G$, then the procedure places the gyroscope in sleep mode. An amount of rotation, $\theta_i$, of the door is computed from $g_{x,i}$, $g_{x,i-1}$ ..., $g_{x,i*}$, such as according to Eq. 10 above.

Task 816: The procedure determines if $\theta_i$ is greater than or equal to $\theta_{open}$ (which is a specified threshold representing an amount of rotation indicating that the door has been opened). If $\theta_i$ is not greater than or equal to $\theta_{open}$, then the process returns to task 802 (the door status remains indicated as closed).

Task 818: If $\theta_i$ is greater than or equal to $\theta_{open}$, then the procedure changes the door status to "Open." The procedure can send an indication of the open status to a target entity.

Task 820: If the determination at task 808 indicates that the gyroscope is not activated, then the procedure determines whether a parameter useAccelForDoorDecision is set to True. If so, that indicates that acceleration data is to be used for determining whether the door is closed.

Task 822: If the parameter useAccelForDoorDecision is not set to True, then the procedure determines, based on variance data $\sigma_{t,i}^2 \ldots \sigma_{t,i-K}^2$ (computed from tangential acceleration data in task 806), whether there is a possible door event. K represents a size of a time window over which a determination is to be made regarding whether a possible door event should trigger activation of the gyroscope. If it is determined there is not a possible door event, then the process returns to task 802. The determination if there is a possible door event based on $\sigma_{t,i}^2 \ldots \sigma_{t,i-K}^2$ may involve the following:

Compute $n_t=|\{i \leq j < i-K : |\sigma_{t,i}^2|>L_t\}|$, where $L_t$ is a threshold to determine whether the variance is significant and possibly due to door movement. $L_t$ may depend upon the sampling frequency $f_s$. An example value of $L_t$ is 0.6 when $f_s=50$ Hz. Other values of $L_t$ can be used in other examples.

If $n_t>C_t$, where $C_t$ is a specified threshold depending upon $f_s$, then it is likely there is a possible door event. In the above, $C_t$ may be set to 3 when $f_s=50$ Hz, in some examples. Other values of $C_t$ can be used in other examples.

Task 824: If it is determined at task 822 that there is a possible door event, then the procedure activates the gyroscope, and the procedure sets i*=i (to indicate the time point at which the gyroscope was activated).

Task 826: If the parameter useAccelForDoorDecision is set to True (as determined at 820), then the procedure sets the parameter useAccelForDoorDecision to True, and sets $\hat{i}=i$. Also, the procedure computes a threshold $T_A$ based on $g_{x,i}$, $g_{x,i-1}$ ..., $g_{x,i*}$. $T_A$ is used to control how long the accelerometer is to be used to determine whether the door is in a closed position. $T_A$ may be determined by $g_{x,i}$, $g_{x,i-1}$ ..., $g_{x,i*}$ as follows. Let G denote a specified threshold that depends upon $f_s$, e.g., $G=f_s$.

Compute $n_G=|\{i \leq j < i-G : |a_i|>L_G\}|$ from $g_{x,i}$, $g_{x,i-1}$ ..., $g_{x,i-G+1}$, where $L_G$ is a threshold set according to the gyroscope's typical readings in a stationary position without movement. An example value of $L_G$ is 0.2. Other values of $L_G$ can be used in other examples.

If $n_G>C_G$, where $C_G$ is a specified threshold depending upon $f_s$, then it is likely that the gyroscope is not yet stabilized due to door movement. As a result, $T_A$ is set to a larger value, e.g., $20f_s$; otherwise, since the gyroscope is stabilized, $T_A$ is set to a smaller value, e.g., $15f_s$. In the above, $C_G$ may be set to 3 when $f_s=50$ Hz. Other values of $C_G$ can be used in other examples.

Task 828: The procedure determines if the elapsed time $(i-\hat{i})$ is greater than or equal to $T_A$. If not, the process returns to task 802.

Task 830: If the elapsed time $(i-\hat{i})$ is greater than or equal to $T_A$, then the procedure determines based on the filtered tangential acceleration data $t'_i t'_{i-1} \ldots t'_{\hat{i}}$ if the door is in the closed position. If not, then the process returns to task 802.

Task 832: If it is determined at task 830 that the door is in the closed position, then the procedure changes the door status to "Closed," and can send an indication of the closed status to a target entity.

Use of Multiple Filters

The foregoing procedure of FIGS. 8A-8B uses a single IIR filter to filter acceleration data.

In some implementations of the present disclosure, multiple different filters can be used to filter acceleration data, to address the dilemma when selecting a single IIR filter to meet both conditions C1 and C2 can be difficult or suboptimal.

The following solution uses two filters (a short filter and a long filter) to perform door status detection.

S1. Monitor the tangential acceleration data from the accelerometer. If a substantial jump in the tangential acceleration data is detected, continue to S2.

S2. Activate the gyroscope to track the angle movement.
  a. If the angle movement is away from the door frame and the turned angle is large enough, a door open event is reported;
  b. If the angle movement is small, continue to S3.

S3. Check if the filtered tangential acceleration data (filtered using a short filter) is stable and close to a bias trained by using the same short filter when the door is closed and at a stationary position. If the answer is yes, a door close event is reported; otherwise continue to S4.

S4. Check if the filtered tangential acceleration data (filtered using a long filter) is stable and close to a bias trained by using the same long filter when the door is closed and at a stationary position. If the answer is yes, a door close event is reported.

The short filter ensures that successful detection can be promptly completed in normal conditions and thus condition C1 is met. The long filter ensures that robust and reliable detection is possible in adverse conditions (e.g., in strong winds or on an open sea or in other unstable environments) and thus condition C2 is met.

Figure 9A:
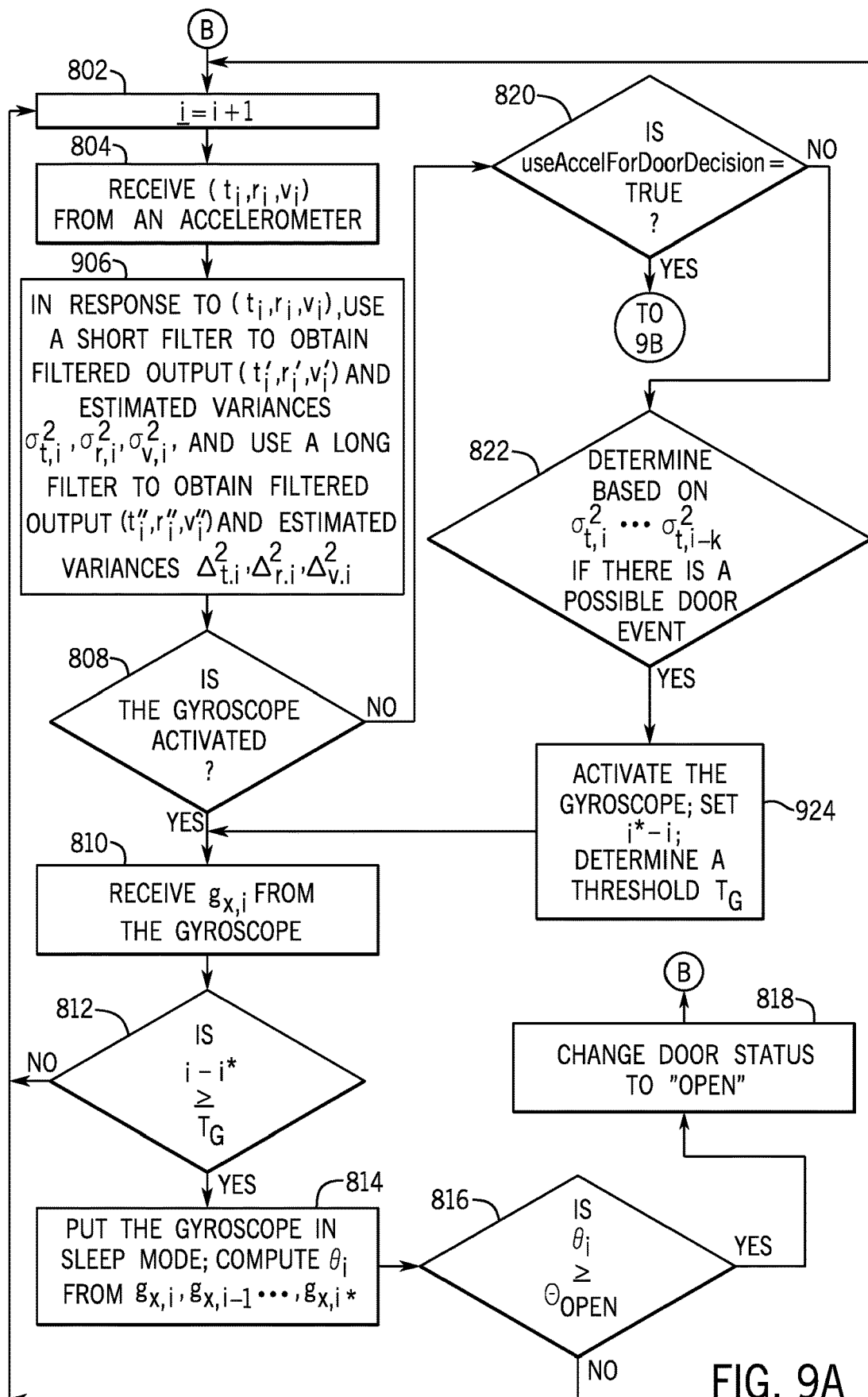
FIGS. 9A-9B are a flow diagram of determining an open/close status of a door using multiple filters, according to additional examples.
Figure 9B:
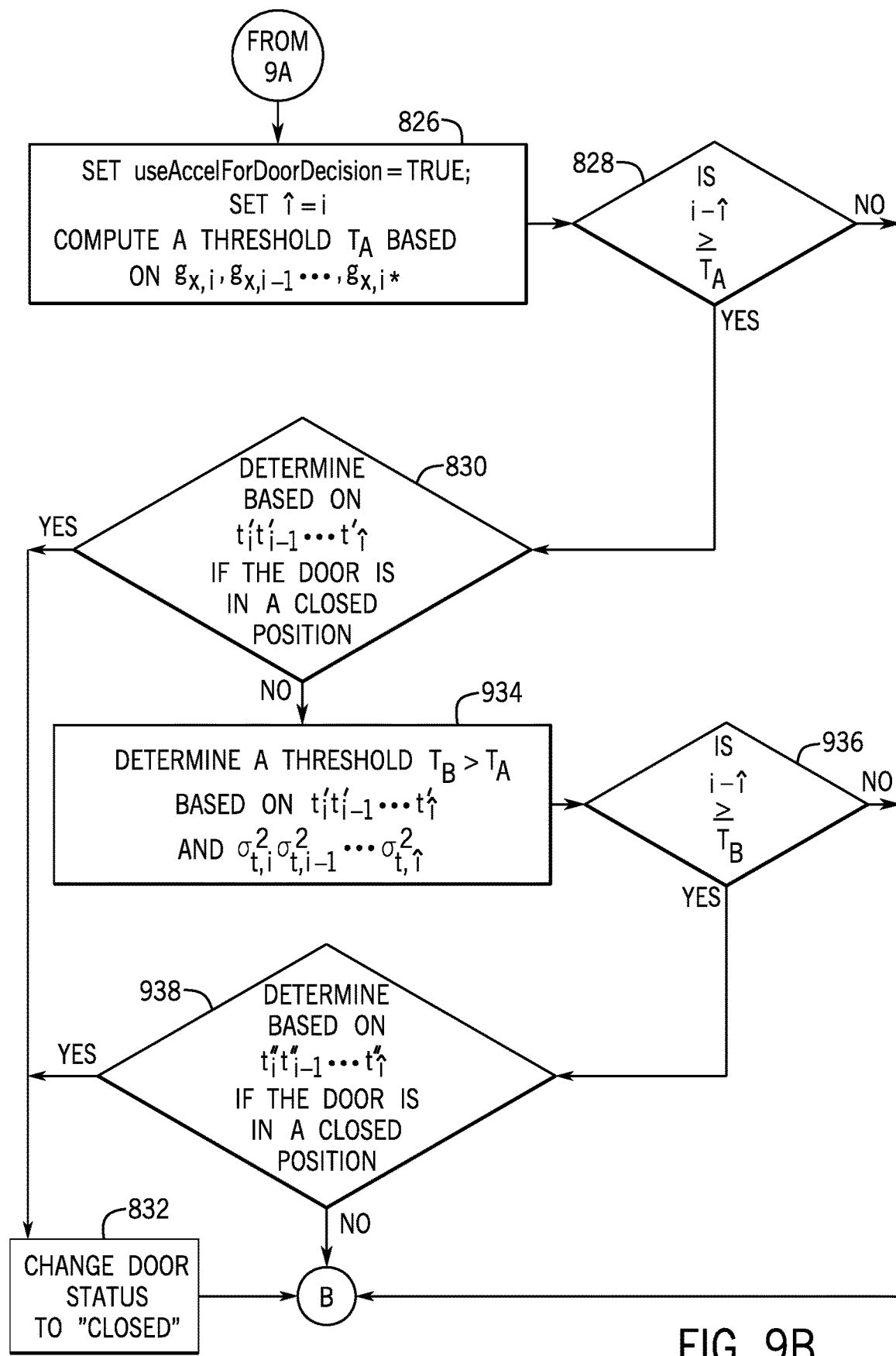

FIGS. 9A-9B illustrate a procedure where a long filter and a short filter are used. In FIGS. 9A-9B, similar tasks as those depicted in FIGS. 8A-8B are assigned the same reference numerals. The following describes just the changed tasks or new tasks in FIGS. 9A-9B, as compared to the tasks of FIGS. 8A-8B.

Task 906: Based on the acceleration data $(t_i, r_i, v_i)$ from the accelerometer received at 804, first filtered acceleration data $(t'_i, r'_i, v'_i)$ and first variances $(\sigma_{t,i}^2, \sigma_{r,i}^2, \sigma_{v,i}^2)$ are derived using the short IIR filter, and second filtered data $(t''_i t''_{i-1} \ldots t''_{\hat{\iota}})$ and second variances $(\Delta_{t,i}^2, \Delta_{r,i}^2, \Delta_{v,i}^2)$ are derived using the long IIR filter.

Task 924: If it is determined at task 822 that there is a possible door event, then the procedure activates the gyroscope, and the procedure sets i*=i, and determines a threshold $T_G$. $T_G$ may be adjusted according to $\sigma_{t,i}^2 \ldots \sigma_{t,i-K}^2$, e.g., if significantly large values are observed in $\sigma_{t,i}^2 \ldots \sigma_{t,i-K}^2$, $T_G$ may be adjusted higher. Let U denote a positive threshold, and let N(U) denote the number of times that $\sigma_{t,i}^2 \ldots \sigma_{t,i-K}^2$ are over U, i.e., N(U)=|{j: $\sigma_{t,j}^2$>U,i-K≤j≤i}|, where |S| denotes the cardinality of a set S. Then if N(U) is less than a specified threshold, then $T_G$ is set to a default value, say 3 seconds; otherwise, if N(U) is greater than or equal to the specified threshold, then $T_G$ is adjusted to a larger value, say 5 seconds. The threshold U may be learned from offline training data, and may depend upon what filter is being used. Example values of U are 0.1 meter per squared second (m/s²), 0.5 m/s², 1 m/s², or another value. The threshold used to check N(U) is likely dependent upon the sampling frequency $f_s$, and U. Example values of such a threshold for $f_s$=50 Hz is 25, 30, 50, 100, or another value.

Task 830: If the elapsed time $(i-\hat{\iota})$ is greater than or equal to $T_A$, then the procedure determines based on the filtered tangential acceleration data $t'_i t'_{i-1} \ldots t'_{\hat{\iota}}$ (filtered using the short filter) if the door is in the closed position. If not (which means that the procedure is unable to determine the door closed status using filtered tangential acceleration data filtered using the short filter), then the procedure proceeds to task 934.

Task 832: If it is determined at task 830 that the door is in the closed position, then the procedure changes the door status to "Closed," and can send an indication of the closed status to a target entity.

Task 934: If the procedure is unable to determine (at 830) based on the filtered acceleration data $t'_i t'_{i-1} \ldots t'_{\hat{\iota}}$ (filtered using the short filter) that the door is not in the closed position, then the procedure determines another threshold, $T_B > T_A$, based on $t'_i t'_{i-1} \ldots t'_{\hat{\iota}}$ and $\sigma_{t,i}^2 \sigma_{t,i-1}^2 \ldots \sigma_{t,\hat{\iota}}^2$. $T_B$ may be based on $t'_i t'_{i-1} \ldots t'_{\hat{\iota}}$ and $\sigma_{t,i}^2 \sigma_{t,i-1}^2 \ldots \sigma_{t,\hat{\iota}}^2$ by using a method similar to the one used to determine $T_G$ above. That is, $T_B$ may be adjusted higher if significantly large values are observed in $\sigma_{t,i}^2 \sigma_{t,i-1}^2 \ldots \sigma_{t,\hat{\iota}}^2$. Similar to the technique discussed above for determining $T_G$, the procedure can choose between a default value and a second value that is larger than the default value for $T_B$. In addition, the filtered tangential acceleration data $t'_i t'_{i-1} \ldots t'_{\hat{\iota}}$ (filtered using the short filter) may be used to adjust $T_B$. Specifically, the procedure can check the number of times $N_t$ that $t'_i t'_{i-1} \ldots t'_{\hat{\iota}}$ deviate from a trained mean, i.e., how many times the following condition is not met in the time period $\hat{\iota}, \hat{\iota}+1, \ldots, i-1, i$:

$$|t'_j - \bar{\mu}_t| < C_1 \bar{\mu}_t + C_2 \sqrt{\sigma_t^2}, \hat{\iota} \le j \le i.$$

If $N_t$ is less than a specified threshold, then $T_B$ is determined according to $\sigma_{t,i}^2 \sigma_{t,i-1}^2 \ldots \sigma_{t,\hat{\iota}}^2$ by using a method similar to that described for $T_G$ above; otherwise, $T_B$ is adjusted to a third value that is larger than the default value. Note that the second value and the third value may be the same in some cases.

Task 936: The procedure determines if the elapsed time $(i-\hat{\iota})$ is greater than or equal to $T_B$. If not, then the procedure returns to task 802.

Task 938: If the elapsed time $(i-\hat{\iota})$ is greater than or equal to $T_B$, then the procedure determines based on the filtered tangential acceleration data $t''_i t''_{i-1} \ldots t''_{\hat{\iota}}$ (filtered using the long filter) if the door is in a closed position. If the procedure is able to determine that the door is in the closed position, then the procedure proceeds to task 832. However, if the procedure is unable to determine that the door is in the closed position, then the procedure returns to task 802.

Note that the biases used to determine whether the door is closed or not based on $t''_i t''_{i-1} \ldots t''_{\hat{\iota}}$ can be different from the biases used together with $t'_i t'_{i-1} \ldots t'_{\hat{\iota}}$. These biases may be trained using a method similar to that described below, but with its own set of parameters, which in turn depend upon the filter (short filter or long filter) selected.

Motion Detection

Door status detection is enabled only when the moveable platform is not in motion. As discussed above, to detect the motion status of the moveable platform, the motion detection module 208 (FIG. 2) makes use of acceleration data from an accelerometer (e.g., 112 in FIG. 2). Specifically, let $v_i$ denote the vertical (gravitational) component of the acceleration data (hereinafter referred to as the "vertical acceleration data") from the accelerometer at time instant i. The proposed solution detects the motion status as follows.

Figure 10:
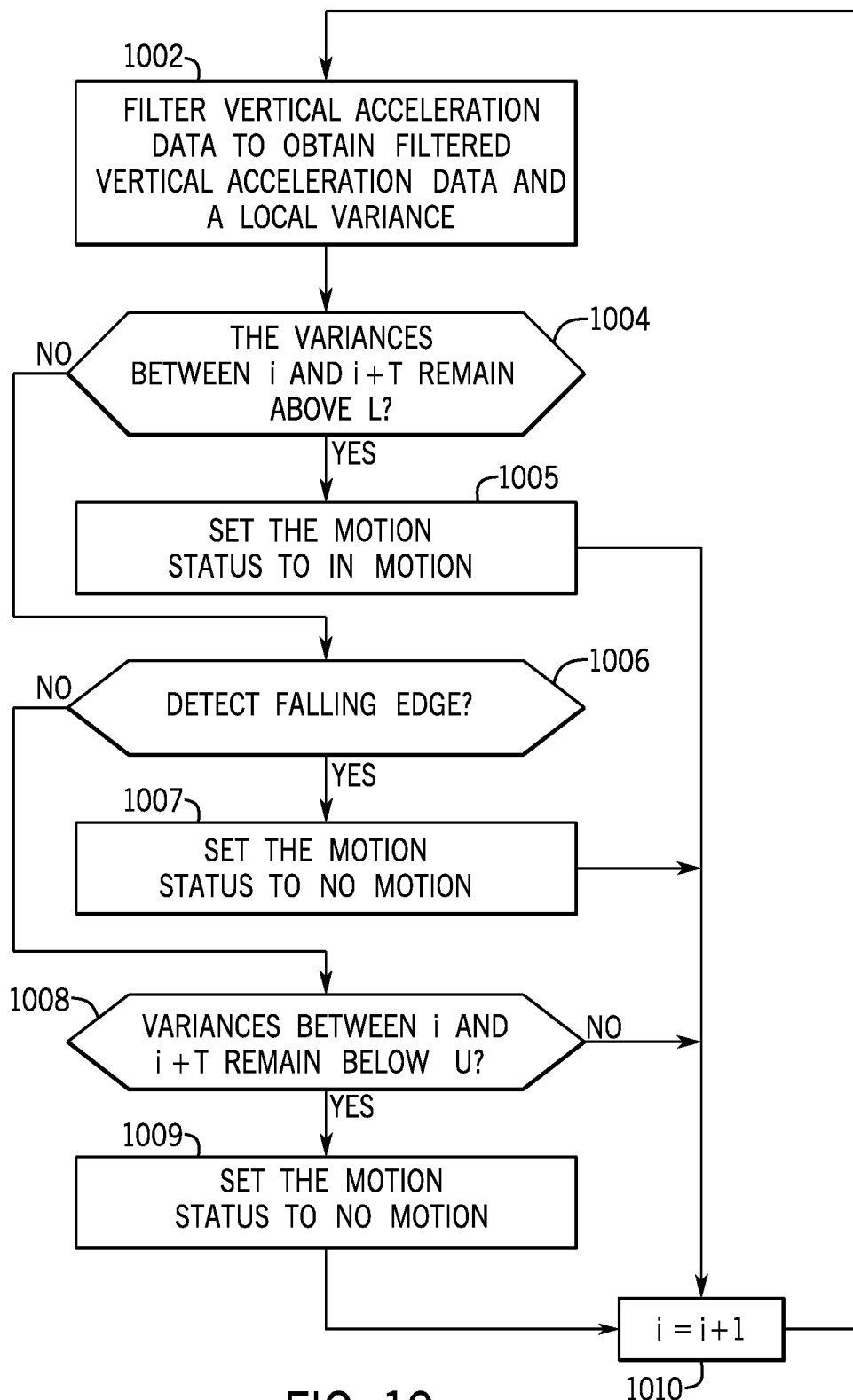
FIG. 10 is a flow diagram of a process of detecting motion of a moveable platform, according to some examples.

FIG. 10 is a flow diagram of a motion detection procedure according to some examples, which can be performed by the motion detection module 208, for example. The following describes tasks of FIG. 10.

Task 1002: The motion detection procedure filters the vertical acceleration data $v_i$ to obtain filtered vertical acceleration data $\bar{v}_i$, and to estimate a local variance $\sigma_{v,i}^2$.

Task 1004: If the variances (variance values) in a motion detection time window between time instants i and i–T ($\sigma_{v,i}^2 \ldots \sigma_{v,i-T}^2$) remain above a specified threshold L>0 (i.e., each of $\sigma_{v,i}^2 \ldots \sigma_{v,i-T}^2$ remains above L), the motion detection procedure proceeds to task 1005; otherwise, the motion detection procedure continues to task 1006. The motion detection procedure detects the variances in the motion detection time window between time instants i and i–T being above L by using a counter to count a number of time instants that the variances are above L; if the counter counts that there has been T consecutive variances above L, then the procedure proceeds to task 1005. T is a specified constant set according to the sampling frequency $f_s$ of the accelerometer. An example value of T is $5f_s$ or $10f_s$ or some other value.

Task 1005: The motion detection procedure sets the motion status to "in motion" and continues to task 1010.

Task 1006: The motion detection procedure detects whether there is a falling edge in the variances between time instants i and i–m ($\sigma_{v,i}^2 \ldots \sigma_{v,i-m}^2$), where m is a specified positive integer number. If a "falling edge" (explained below) is detected, the motion detection procedure proceeds to task 1007; otherwise, the procedure continues to task 1008.

Task 1007: The motion detection procedure sets the motion status to "no motion", and continues to task 1010.

Task 1008: If the variances in a motion detection time window between time instants i and i–T ($\sigma_{v,i}^2 \ldots \sigma_{v,i-T}^2$) remain below a specified threshold 0<U<L, the motion detection procedure proceeds to task 1009; otherwise the procedure proceeds to task 1010. The motion detection procedure detects the variances in the motion detection time window between time instants i and i–T being below U by using a counter to count a number of time instants that the variances are below U; if the counter counts that there has been T consecutive variances above U, then the motion detection procedure proceeds to task 1009.

Task 1009: The motion detection procedure sets the motion status to "no motion".

Task 1010: The motion detection procedure increments i, i=i+1, and re-iterates tasks 1002-1009.

Figure 11:
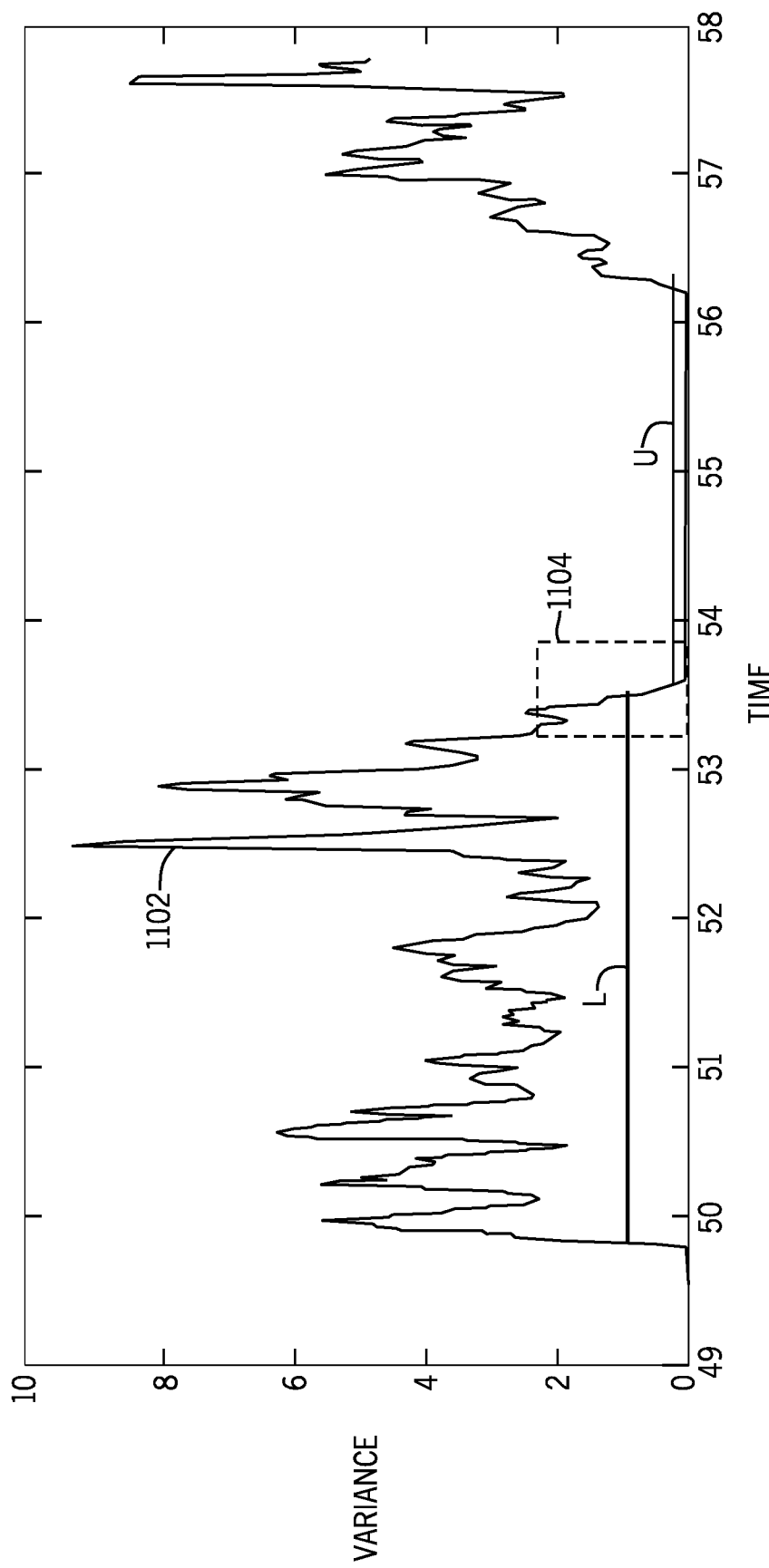
FIG. 11 is a graph illustrating variance values as a function of time, for detecting motion of a moveable platform, according to some examples.

FIG. 11 shows a curve 1102 that represents variances (vertical axis) as a function of time (horizontal axis). FIG. 11 also depicts the thresholds L and U, as well as a falling edge 1104 in the variances. In FIG. 10, the falling edge 1104 is detected in task 1106, based on a detection of variances in a falling edge time window between time instants i and i–m ($\sigma_{v,i}^2 \ldots \sigma_{v,i-m}^2$). A "falling edge" refers to a drop in the variances from a level that is above the threshold L to a level that is below the threshold U. The falling edge 1104 indicates a transition of the moveable platform from being in motion to being not in motion.

In FIG. 11, prior to the falling edge 1104, the moveable platform is indicated to be in motion since the variances in a motion detection time window between time instants i and i–T ($\sigma_{v,i}^2 \ldots \sigma_{v,i-T}^2$) before the falling edge 1104 is above the threshold L. After the falling edge 1104, the moveable platform is indicated to be not in motion if the variances in a motion detection time window between time instants i and i–T ($\sigma_{v,i}^2 \ldots \sigma_{v,i-T}^2$) remain below U.

When $f_s$=50 Hz, an example value of L is 0.5 and an example value of U is 0.08. When the sampling frequency $f_s$ changes, different L and U can be used. In other examples, other values of L and U can be used.

Note that the proposed motion detection solution above is asymmetric in that it uses both edge detection and a counter associated with an upper bound U to detect "no motion" and it uses only a counter associated with a lower bound to detect "in motion". The primary reason for such an asymmetric design is that the requirements for detecting "in motion" and those for detecting "no motion" are different.

A "no motion" status is detected within a few seconds (depending upon the sampling frequency of the accelerometer) after the moveable platform comes to a stop so that door status detection is ready to use. Since detection of a falling edge can be faster than determining whether $\sigma_{v,i}^2 \ldots \sigma_{v,i-T}^2$ remains below U, the solution chooses to use a hybrid approach of detecting "no motion" status where both edge detection and a variance upper bound are used.

The detection of "in motion" status is expected to be robust but is subject to less stringent time constraint than the detection of "no motion" status.

In task 1002 in FIG. 10, an IIR filter with coefficient α may be used to filter the vertical acceleration data $v_i$ and to estimate $\sigma_{v,i}^2$ recursively as follows.

$$\bar{v}_i = \alpha v_i + (1-\alpha)\bar{v}_{i-1},$$

$$\bar{V}_{v,i} = \alpha v_i^2 + (1-\alpha)\bar{V}_{v,i-1},$$

$$\sigma_{v,i}^2 = \bar{V}_{v,i} - (\bar{v}_i)^2.$$

In the foregoing, the variance $\sigma_{v,i}^2$ of the vertical acceleration data at time point i is computed based on calculating a square of the vertical acceleration data ($v_i^2$). Examples of the coefficient α are 0.008 and 0.016 when the sampling frequency of the accelerometer is 50 Hz. The coefficient α may be scaled by $f_s/50$ when the sampling frequency $f_s$ is not 50 Hz. In other examples, other values of the coefficient α may be used.

In some cases, the variance $\sigma_{v,i}^2$ may be further filtered by using a second IIR filter to obtain $\bar{\sigma}_{v,i}^2$ for more stability. In these cases, $\bar{\sigma}_{v,i}^2$ will be used in place of $\sigma_{v,i}^2$ in the motion detection solution above. An example of such a second IIR filter is a filter with coefficient α set to 0.02 or some other value.

Training

To use the first filtered tangential acceleration data $t'_i t'_{i-1} \ldots t'_i$ (filtered using the short filter) to detect whether a door is in a closed position, the DOC process according to some implementations checks if both of the following conditions hold for all $t'_i t'_{i-1} \ldots t'_{i-D}$, where D is a specified constant depending upon the sampling frequency $f_s$. An example value of D is $2f_s$ which is equivalent to 2 seconds in an example. In other examples, other values of D can be used.

$$|t'_j - \bar{\mu}_t| < C_1 \bar{\mu}_r + C_2 \sqrt{\bar{\sigma}_t^2}$$

$$\sigma_{t,i}^2 < C_3 \bar{\sigma}_t^2$$

In the above, $\bar{\mu}_t$, $\bar{\mu}_r$, and $\bar{\sigma}_t^2$ are respectively the tangential bias due to gravity, the radial bias due to gravity, and the tangential noise level. Similar checks are performed for the second filtered tangential acceleration data $t''_i t''_{i-1} \ldots t''_i$ (filtered using the long filter), where a different set of ($\bar{\mu}_t$, $\bar{\mu}_r$, $\bar{\sigma}_t^2$) may be used. In the above, an example value of the constant $C_1$ is 0.0175, which is roughly equal to sin(1*pi/180) and obtained by using the Taylor series of the sine or cosine function. An example value of the constant $C_2$ is 2.5758 and an example value of the constant $C_3$ is $(C_2)^2$. In other examples, other values of $C_1$, $C_2$, and $C_3$ can be used.

In accordance with some implementations, the DOC process can train the bias values and the noise levels ($\bar{\mu}_t$, $\bar{\mu}_r$, $\bar{\sigma}_t^2$). The training process is initiated as soon as the moveable platform's motion status is detected to be in "no motion". Let $i_0$ denote the starting time of the training (or learning) process.

To account for the possibility that a previous known door state may be wrong, the training process can run as long as one of the following conditions is true:
 a. The current door status is either closed or unknown.
 b. $\sigma_{t,i}^2 < F$ and optionally $\sigma_{r,i}^2 < F$, where F is a specified threshold. An example value of F is 0.01 when the sampling frequency is 50 Hz. In other examples, other values of F can be used.

The training process computes the mean and variance of the radial acceleration data ($\mu_{r,i}$, $\sigma_{r,i}^2$) and the mean and variance of the tangential acceleration data ($\mu_{t,i}$, $\sigma_{t,i}^2$). For example, ($\mu_{t,i}$, $\sigma_{t,i}^2$) may be computed using Eqs. 1-4 discussed above, which are reproduced below.

$$\mu_{t,i} = \frac{S_{t,i}}{K}, \qquad \text{(Eq. 1)}$$

$$\sigma_{t,i}^2 = \frac{S_{t2,i}}{K} - \mu_{t,i}^2, \qquad \text{(Eq. 2)}$$

$$S_{t,i} = \sum_{j=i-K+1}^{i} t_j, \qquad \text{(Eq. 3)}$$

$$S_{t2,i} = \sum_{j=i-K+1}^{i} t_j^2. \qquad \text{(Eq. 4)}$$

The values of ($\mu_{r,i}$, $\sigma_{r,i}^2$) can be computed in a similar manner. In the above, K is the window length used to compute the mean and variances, and may depend upon the sampling frequency $f_s$.

Figure 12:
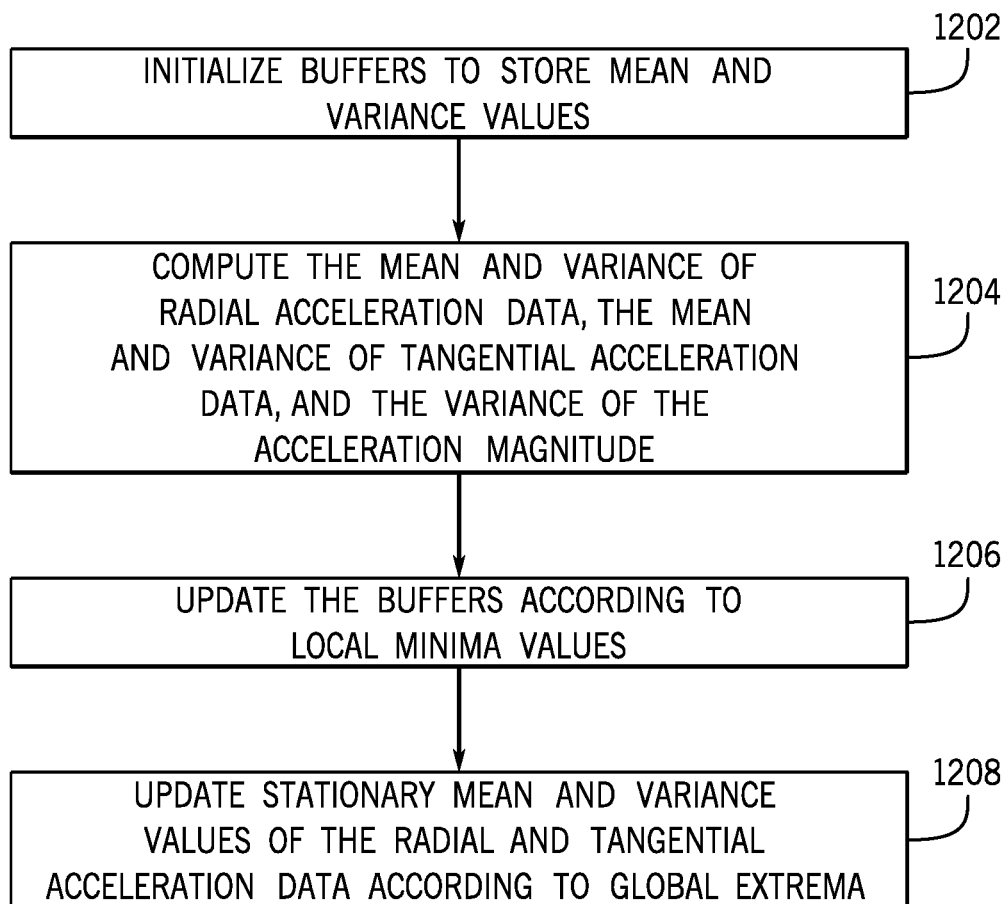
FIG. 12 is a flow diagram of a training process for computing stationary mean and variance values of acceleration data, according to further examples.

The training process of learning stationary values of acceleration data (radial acceleration data and tangential acceleration data) is depicted in FIG. 12.

Task 1202: The process initializes the following buffers that are used in the training process: $A_M$, $A_t$, $A_r$, $B_t$, and $B_r$. The $A_t$ buffer is used to store a computed stationary mean value of the tangential acceleration data, the buffer $A_r$ is used to store a computed stationary mean value of the radial acceleration data, the buffer $B_t$ is used to store a computed stationary variance value of the tangential acceleration data, and the buffer $B_r$ is used to store a computed stationary variance value of the radial acceleration data. The buffer $A_M$ is used to store a stationary variance value of the acceleration magnitude ($M_i$ calculated according to $M_i = \sqrt{r_i^2 + t_i^2 + v_i^2}$) of the acceleration data.

Let N be a positive integer. Example values of N can be 7, 8, 11, 13, 16, 17, and so forth. The training process then divides the sequence of acceleration data samples into N sub-sequences. In some examples, N buffers are used to store the respective variance and mean values computed for the respective sub-sequences.

If N buffers are used, then there are: N $A_M$ buffers, represented as $A_{M,0}$ to $A_{M,N-1}$; N $A_t$ buffers, represented as $A_{t,0}$ to $A_{t,N-1}$; N $A_r$ buffers, represented as $A_{r,0}$ to $A_{r,N-1}$; N $B_t$ buffers, represented as $B_{t,0}$ to $B_{t,N-1}$; and N $B_r$ buffers, represented as $B_{r,0}$ to $B_{r,N-1}$.

Although FIG. 12 refers to an example where specific buffers are used, it is noted that in other examples, other data structures can be used to store the respective values.

Task 1204: The training process computes the mean and variance of the radial acceleration data ($\mu_{r,i}$, $\sigma_{r,i}^2$), and the mean and variance of the tangential acceleration data ($\mu_{t,i}$, $\sigma_{t,i}^2$) using computations similar to that performed in Eqs. 1-4 above.

Task 1206: Since a sequence of acceleration data samples is divided into N sub-sequences, in some examples, N buffers are used to store the respective variance and mean values computed for the respective sub-sequences. The training process updates the buffers according to local minima values, as follows. Let s=i mod N. If $\max(\sigma_{t,i}^2, \sigma_{r,i}^2) < A_{M,s}$, then update the buffers as follows.

$$A_{M,s} = \max(\sigma_{t,i}^2, \sigma_{r,i}^2),$$

$$A_{t,s} = \mu_{t,i},$$

$$A_{r,s} = \mu_{r,i},$$

$$B_{t,s} = \sigma_{t,i}^2,$$

$$B_{r,s} = \sigma_{r,i}^2.$$

In the foregoing, s=0 ... N−1, and if $\max(\sigma_{t,i}^2, \sigma_{r,i}^2)$ at time point i is less than the value in the buffer $A_{M,s}$, then the buffer $A_{M,s}$ is updated with the value $\max(\sigma_{t,i}^2, \sigma_{r,i}^2)$ (i.e., maximum of $\sigma_{t,i}^2$ and $\sigma_{r,i}^2$), and the remaining buffers $A_{t,s}$, $A_{r,s}$, $B_{t,s}$, and $B_{r,s}$ are updated with respective mean and variance values $\mu_{t,i}$, $\mu_{r,i}$, $\sigma_{t,i}^2$, and $\sigma_{r,i}^2$.

Effectively, after all of the tangential and radial acceleration data samples have been processed, the N buffers $A_{t,0}$ to $A_{t,N-1}$ contain N respective local minima of the mean $\mu_{t,i}$ of the tangential acceleration data samples. Similarly, the N buffers $A_{r,0}$ to $A_{r,N-1}$ contain N respective local minima of the mean $\mu_{r,i}$ of the radial acceleration data samples, the N buffers $B_{t,0}$ to $B_{t,N-1}$ contain N respective local minima of the variance $\sigma_{t,i}^2$, of the tangential acceleration data samples, and the L buffers $B_{r,0}$ to $B_{r,N-1}$ contain N respective local minima of the variance $\sigma_{r,i}^2$ of the radial acceleration data samples.

Task 1208: If $i - i_0 \geq T_0$ or a door open event is detected, where $T_0$ is a specified time limit for training since motion status is changed to "no motion," then the training process updates the stationary mean and variance values of the radial and tangential acceleration data according to global extrema. More specifically, in some examples, the training process finds the index $l^* = \arg\max_l A_{M,l}$, which finds the maximum (an example of the global extrema) of each of the variance values in the N buffers $A_{M,0}$ to $A_{M,N-1}$. Note that $T_0$ represents a learning time period expressed as a number of acceleration data samples. An example value of $T_0$ is 30*50, which is equivalent to 30 seconds when the sampling frequency is 50 Hz. In other examples, other values of $T_0$ can be used. After learning for $T_0$ samples, the mean and variance values of the radial and tangential acceleration data is updated as $\bar{\mu}_t$, $\bar{\mu}_r$, $\bar{\sigma}_t^2$, and $\bar{\sigma}_r^2$. Task 1208 includes:
 recording $\bar{\mu}_t = A_{t,l^*}$ and $\bar{\mu}_r = A_{r,l^*}$ as the stationary estimates of tangential and radial components, respectively;
 recording $\bar{\sigma}_t^2 = B_{t,l^*}$ and $\bar{\sigma}_r^2 = B_{r,l^*}$ as the estimates of tangential and radial variance corresponding to the stationary values, respectively; and
 resetting $A_M$ such that $A_{M,l} = M^*$, $l = 0, \ldots, N-1$.

After the initial training period since motion status changes (the initial training process might end either after $T_0$ samples are processed or at a door open event), a longer training period $T_1$ may be used. For example, $T_1$ may be set to 8*3600*50, which is equivalent to 8 hours when the sampling frequency is 50 Hz. Note that the initial training period applies whenever the motion status is switched from "in motion" to "no motion".

In the above, the task 1206 essentially computes $$\min\{\sigma_{M,i}^2;\ i \bmod N=s\}. \qquad (\text{Eq. 12})$$

As such, the training process described above is a maxmin method. In other examples, a minmax method can be used to estimate the stationary radial and acceleration mean and variance values by altering the order of minimization and maximization operations above.

In some cases, the above training process can be simplified by using $\sigma_{t,i}^2$ in place of $\max(\sigma_{t,i}^2, \sigma_{r,i}^2)$.

In some examples, $\mu_{t,i}$ and $\sigma_{t,i}^2$ may be approximated by using an IIR filter with coefficient $\alpha$ as follows.

$$\mu_{t,i} = \alpha t_i + (1-\alpha)\mu_{t,i-1},$$

$$\overline{V}_{t,i} = \alpha t_i^2 + (1-\alpha)\overline{V}_{t,i-1},$$

$$\sigma_{v,i}^2 = \overline{V}_{v,i} - (\mu_{v,i})^2.$$

Similarly, $\mu_{r,i}$ and $\sigma_{r,i}^2$ may be approximated by using the IIR filter.

More generally, finding the mean and variance of the tangential and radial acceleration data values $\overline{\mu}_t$, $\overline{\mu}_r$, $\overline{\sigma}_t^2$, and $\overline{\sigma}_r^2$ involves 1) finding local extrema values (minimum values or maximum values depending upon whether the maxmin method or the minmax method is used) for respective sub-sequences $\{\sigma_{M,i}^2;\ i \bmod L=s\}$, 2) then finding a global extrema (either maximum or minimum depending upon whether the maxmin method or the minmax method is used) in the local extrema values, and 3) finally determining the mean and variance of the tangential and radial acceleration data values that correspond to the global extrema found (e.g., co-located). For example, if the global extrema is reached at time instant i*, then the mean and variance computed at time instant i*, i.e., $\mu_{t,i^*}, \mu_{t,i^*}, \sigma_{t,i^*}^2$, and $\sigma_{r,i^*}^2$ may be used as the estimates of $\overline{\mu}_t$, $\overline{\mu}_r$, $\overline{\sigma}_t^2$, and $\overline{\sigma}_r^2$, respectively.

The stationary mean and variance values of the tangential and radial acceleration data values $\overline{\mu}_t$, $\overline{\mu}_r$, $\overline{\sigma}_t^2$, and $\overline{\sigma}_r^2$ can be used directly in detecting convergence of the tangential and radial acceleration data as discussed above for determining whether a door close event has occurred. For each learning period, the current stationary mean tangential and acceleration data values $\overline{\mu}_t$ and $\overline{\mu}_r$ can be used for the next T samples until new estimates are available for the next learning period.

Combined Door Status Detection and Motion Detection

In some cases, activation of the gyroscope in the DOC process may be further improved to distinguish normal door operations from full-body moveable platform movement, e.g., the moveable platform may turn when a vehicle towing the moveable platform is making a turn or the moveable platform may swivel around when the moveable platform is lifted by a crane. In these cases, vertical acceleration data may be used in conjunction with tangential acceleration data in the DOC process. This is based on the observation that vertical variance is typically higher in full body movement than in normal door operations. As such $gi_i$ (the gyroscope activation indication) may be set to 0 (to maintain the gyroscope deactivated) if large vertical variance is observed in the absence of large tangential variance. Note that when the moveable platform is moving with its door in the open position, significant tangential variance may be observed. In one example, $gi_i$ is set to 0 if the following conditions are both satisfied:

i) $\sigma_{v,i}^2$ is greater than a specified threshold, say 0.2, 0.3, 1, or some other value.

ii) $\sigma_{t,i}^2$ is less than a specified threshold, say 5, 10, 20, or some other value.

In another example, a third condition a $\sigma_{v,i}^2 > \sigma_{t,i}^2$ may have to be satisfied as well. Generally, the foregoing criteria specify that the gyroscope is not to be turned on if the vertical variance is large (greater than a specified threshold), and the tangential variance is small (less than a specified threshold).

Figure 13:
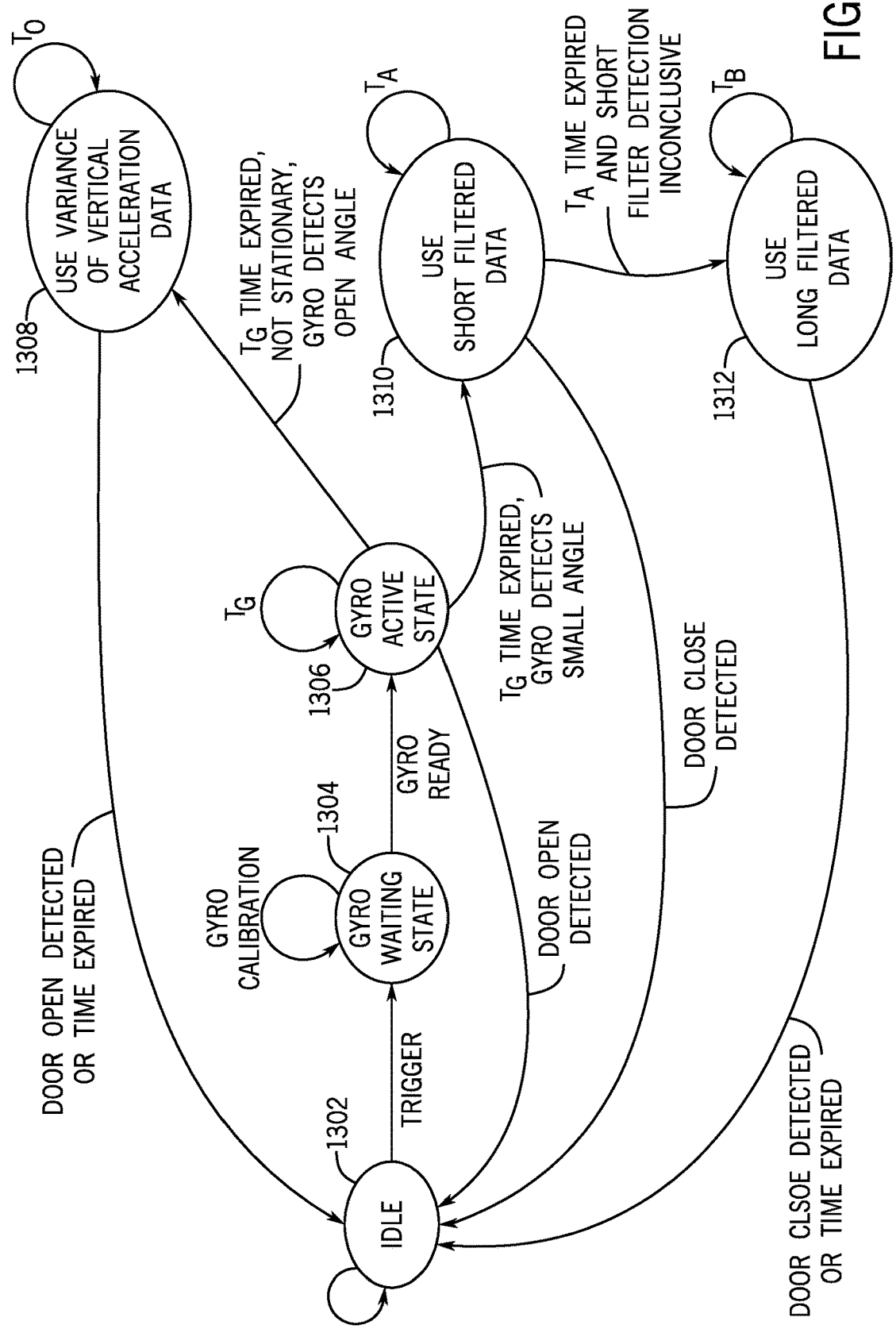
FIG. 13 is a flow diagram of a process of determining an open/close status of a door according to further examples.

To further improve robustness of door status detection against full body movement, in some cases the DOC process may be modified to track vertical acceleration data in determining whether the door is in the open position or not. Specifically, as shown in FIG. 13, the DOC process starts in an idle state, where the gyroscope is deactivated. In response to detecting a trigger (such as based on the condition in task 822 of FIG. 9A), the DOC process transitions to a gyroscope waiting state 1304 (where gyroscope calibration can be performed as part of activating the gyroscope). Upon completion of the gyroscope calibration, the gyroscope is ready for operation, and the DOC process transitions to the gyroscope active state 1306 where the gyroscope waits for time duration $T_G$ and determines whether the door has moved to the open position in response to the aggregate value, $a_j$, computed based on measurements from the gyroscope over the time duration $T_G$. If the door is detected to be open, the the DOC process transitions back to the idle state 1302.

However, if the time duration $T_G$ expires and the DOC process detects a door open angle (the angle of rotation of the door is greater than $\theta_{open}$ as determined at task 816 in FIG. 9A) but that the moveable platform is not stationary, the DOC process transitions from the state 1306 to a state 1308 where the DOC process may continue tracking the vertical variance, $\sigma_{v,i}^2$, of the vertical acceleration data for a time duration $T_O$ to make sure that the angle movement is not due to full body movement of the moveable platform due to making a turn or some other movement. For example, the DOC process may report that the door is in the open position only if a $\sigma_{v,i}^2$ remains below a specified threshold, e.g., 0.05, 0.1, 0.2, or some other value, which may depend upon the moveable platform and/or door type, for 0.5, 1, 2 seconds, or some other time interval. In the above, $T_O$ may be set for 3, 5, 10 seconds, or some other time duration.

The DOC process returns from the state 1308 to the idle state 1302 in response to the door open status being successfully detected or in response to the time duration $T_O$ expiring and the DOC unable to conclusively determine that the door is open.

From the state 1306, if the time duration $T_G$ expires and the DOC process detects a small angle of rotation of the door (the angle of rotation of the door is less than $\theta_{open}$), the DOC process transitions from the state 1306 to a state 1310 where the DOC process uses short filtered tangential acceleration data (filtered using the short filter) to determine after passage of the time duration $T_A$ (see tasks 828 and 830 in FIG. 9B) whether the door is in the closed state. If a door close status is detected, the DOC process returns from the state 1310 to the idle state 1302.

If the time duration $T_A$ expires and the detection using the short filtered tangential acceleration data is inconclusive, the DOC process transitions from the state 1310 to the state 1312, where the DOC process uses short filtered tangential acceleration data (filtered using the short filter) to determine after passage of the time duration $T_B$ (see tasks 936 and 938 in FIG. 9B) whether the door is in the closed state. If a door close status is detected or the time duration $T_B$ expired and the door close detection is inconclusive, the DOC process returns from the state 1312 to the idle state 1302.

In some other cases, the DOC process may make use of the result of motion detection. For example, if a moveable platform is detected to be in motion, tangential acceleration data is likely subject to significant variation if the door is open. Such observation can lead to the following modifications to the DOC process. If all of the following conditions are satisfied, the DOC process determines that the door is in the closed position.

a) Motion is detected, e.g., by observing vertical acceleration data as described above.

b) Door status is unknown or in the open position.

c) Tangential variance $\sigma_{t,i}^2$ remains below a specified threshold, e.g. 10, 20, or some other value, for an extended period of time, e.g. 20, 30, 60 seconds, or some other time duration.

System Architecture

The processes (e.g., DOC process or training process) described above can be performed by the processor(s) 118 of the sensor device 108, or by processor(s) of a computer system (implemented with a computer or multiple computers), where the computer system is separate from the sensor device 108. In some examples, the processes can be performed by machine-readable instructions executable on the processor(s) 118. The machine-readable instructions can be stored in a non-transitory computer-readable or machine-readable storage medium. The storage medium can include any or some combination of the following: a semiconductor memory device such as a dynamic or static random access memory (a DRAM or SRAM), an erasable and programmable read-only memory (EPROM), an electrically erasable and programmable read-only memory (EEPROM) and flash memory; a magnetic disk such as a fixed, floppy and removable disk; another magnetic medium including tape; an optical medium such as a compact disk (CD) or a digital video disk (DVD); or another type of storage device. Note that the instructions discussed above can be provided on one computer-readable or machine-readable storage medium, or alternatively, can be provided on multiple computer-readable or machine-readable storage media distributed in a large system having possibly plural nodes. Such computer-readable or machine-readable storage medium or media is (are) considered to be part of an article (or article of manufacture). An article or article of manufacture can refer to any manufactured single component or multiple components. The storage medium or media can be located either in the machine running the machine-readable instructions, or located at a remote site from which machine-readable instructions can be downloaded over a network for execution.

In the foregoing description, numerous details are set forth to provide an understanding of the subject disclosed herein. However, implementations may be practiced without some of these details. Other implementations may include modifications and variations from the details discussed above. It is intended that the appended claims cover such modifications and variations.

What is claimed is:

1. An apparatus comprising:
    a sensor device to mount to a barrier pivotable between an open position and a closed position, the barrier mounted on a moveable platform; and
    at least one processor configured to:
        attempt to determine an open/close status of the barrier based on first filtered measurement data produced from measurement data from the sensor device filtered using a first filter, and
        in response to determining that the open/close status is not successfully determined based on the first filtered measurement data, determine the open/close status of the barrier based on second filtered measurement data produced from the measurement data from the sensor device filtered using a second filter different from the first filter.

2. The apparatus of claim 1, wherein the first filter is a short filter, and the second filter is a long filter.

3. The apparatus of claim 2, wherein an impact of an input at a previous time point on an output of the long filter is greater than an impact of the input at the previous time point on an output of the short filter.

4. The apparatus of claim 2, wherein each of the short and longer filters includes a coefficient, the coefficient of the short filter having a smaller value than the coefficient of the long filter.

5. The apparatus of claim 4, wherein the short and long filters are infinite impulse response (IIR) filters.

6. The apparatus of claim 1, wherein the sensor device comprises an accelerometer and a rotation sensor to measure rotation about an axis, wherein the first filter and the second filter are to filter measurement data from the accelerometer.

7. The apparatus of claim 6, wherein the at least one processor is configured to:
    aggregate rotation data from the rotation sensor at a plurality of time points, the aggregating producing an aggregate value that represents an angle of rotation of the barrier;
    determine that the barrier has moved to the open position in response to the aggregate value having a specified relation with respect to a first threshold.

8. The apparatus of claim 6, wherein the at least one processor is configured to:
    compute a first time threshold based on rotation data from the rotation sensor,
    wherein the attempting to determine the open/close status of the barrier based on the first filtered measurement data from the sensor device filtered using the first filter uses the first filtered measurement data in a time window having a length based on the first time threshold.

9. The apparatus of claim 8, wherein the at least one processor is configured to:
    in response to determining that the open/close status is not successfully determined based on the first filtered measurement data, compute a second time threshold based on at least a portion of the first filtered measurement data,
    wherein the determining the open/close status of the barrier based on the second filtered measurement data from the sensor device filtered using the second filter uses the second filtered measurement data in a time window having a length based on the second time threshold.

10. The apparatus of claim 9, wherein the computing the second time threshold based on the at least a portion of the first filtered measurement data uses variances computed using the first filter.

11. The apparatus of claim 6, wherein the rotation sensor is initially in a low power state, and wherein the at least one processor is configured to:
    compute a variance based on acceleration data from the accelerometer; and trigger the rotation sensor to transition from the low power state to an operational state in response to the computed variance.

12. The apparatus of claim 11, wherein the computed variance comprises a variance of vertical acceleration data and a variance of tangential acceleration data.

13. The apparatus of claim 12, wherein the at least one processor is configured to further use the variance of the vertical acceleration data to determine an open status of the barrier.

14. The apparatus of claim 6, wherein the at least one processor is configured to:
determine the open/close status based on a bias due to gravity, and a noise level.

15. The apparatus of claim 14, wherein the at least one processor is configured to:
determine the bias due to gravity and the noise level by performing a training process.

16. The apparatus of claim 15, wherein the training process comprises:
finding local extrema values for respective sub-sequences of acceleration data samples from the accelerometer, and then finding a global extrema in the local extrema values.

17. A method comprising:
determining, by at least one processor, an open/close status of a pivotable barrier on a moveable platform based on selective use of a plurality of different filters for filtering measurement data from a sensor device, wherein the plurality of different filters comprise a short filter and a long filter, the short filter more sensitive to recent measurement data than the long filter,
wherein the sensor device is mounted on the pivotable barrier and comprises an accelerometer and a rotation sensor to measure rotation about an axis, wherein the short filter and the long filter are to filter measured acceleration data from the accelerometer.

18. The method of claim 17, wherein determining the open/close status comprises:
attempting to determine, based on first filtered measurement data filtered by the short filter, whether the pivotable barrier has moved to a closed position; and
in response to being unable to determine whether the pivotable barrier has moved to the closed position based on the first filtered measurement data, determining, based on second filtered measurement data filtered by the long filter, whether the pivotable barrier has moved to the closed position.

19. The method of claim 17, further comprising:
computing a first time threshold based on rotation data from the rotation sensor; and
attempting to determine the open/close status of the pivotable barrier based on first filtered measurement data from the sensor device in a time window having a length based on the first time threshold, the first filtered measurement data filtered using the short filter.

20. The method of claim 19, further comprising:
in response to determining that the open/close status is not successfully determined based on the first filtered measurement data:
computing a second time threshold based on at least a portion of the first filtered measurement data, and
attempting to determine the open/close status of the pivotable barrier based on second filtered measurement data from the sensor device in a time window having a length based on the second time threshold, the second filtered measurement data filtered using the long filter.

21. A non-transitory machine-readable storage medium storing instructions that upon execution cause at least one processor to:
receive measurement data acquired by a sensor device that is mounted to a pivotable barrier pivotable between an open position and a closed position, the barrier mounted on a moveable platform;
attempt to determine an open/close status of the pivotable barrier on the moveable platform based on first filtered measurement data produced from the measurement data from the sensor device filtered using a first filter; and
in response to determining that the open/close status is not successfully determined based on the first filtered measurement data, determine the open/close status of the pivotable barrier based on second filtered measurement data produced from the measurement data from the sensor device using a second filter different from the first filter.

22. The non-transitory machine-readable storage medium of claim 21, wherein the first filter is a short filter, and the second filter is a long filter, and wherein an impact of an input at a time point on an output of the long filter is greater than an impact of the input at the time point on an output of the short filter.

23. The non-transitory machine-readable storage medium of claim 21, wherein the sensor device comprises an accelerometer and a rotation sensor to measure rotation about an axis, wherein the first filter and the second filter are to filter measurement data from the accelerometer.

* * * * *